(12) United States Patent
Liu et al.

(10) Patent No.: US 12,408,461 B2
(45) Date of Patent: Sep. 2, 2025

(54) SEMICONDUCTOR STRUCTURE WITH ISOLATION STRUCTURE

(71) Applicant: Taiwan Semiconductor Manufacturing Company Limited, Hsin-Chu (TW)

(72) Inventors: Ching-Heng Liu, Miaoli County (TW); Chang Yu Kuo, Miaoli County (TW); Ya-Wen Wu, Hsinchu County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 510 days.

(21) Appl. No.: 17/842,202

(22) Filed: Jun. 16, 2022

(65) Prior Publication Data

US 2023/0411421 A1 Dec. 21, 2023

(51) Int. Cl.
*H10F 39/00* (2025.01)
*H10D 84/80* (2025.01)
*H10F 39/18* (2025.01)

(52) U.S. Cl.
CPC ......... *H10F 39/807* (2025.01); *H10F 39/014* (2025.01); *H10F 39/18* (2025.01); *H10F 39/8067* (2025.01)

(58) Field of Classification Search
CPC ...... H10F 39/80; H10F 39/807; H10F 39/199; H10F 39/8067; H10F 39/18; H10F 39/8053; H10F 39/8063; H10F 19/75; H01L 27/1463; H01L 21/76224–76237; H01L 21/76229; H01L 21/76831; H01L 21/3065; H01L 21/31111; H01L 21/31116; H01L 21/762–76237; H10D 84/0151; H10D 84/0188; H10D 84/80; H10D 30/611
See application file for complete search history.

(56) References Cited

U.S. PATENT DOCUMENTS

| | | | | |
|---|---|---|---|---|
| 5,561,073 A | * | 10/1996 | Jerome | H01L 27/082 257/E21.372 |
| 11,570,387 B2 | * | 1/2023 | Masuda | H10F 39/8063 |
| 2004/0241917 A1 | * | 12/2004 | Schwan | H01L 21/743 438/296 |
| 2020/0006410 A1 | * | 1/2020 | Wu | H10F 39/807 |

* cited by examiner

*Primary Examiner* — Sonya McCall-Shepard
(74) *Attorney, Agent, or Firm* — Cooper Legal Group, LLC

(57) ABSTRACT

A semiconductor structure includes a first shallow trench isolation (STI) structure within a semiconductor substrate. The first STI structure includes a buffer structure, an adhesion structure, an electromagnetic reflection structure, and a fill structure. The adhesion structure is between and adhesively bonded to the buffer structure and the electromagnetic reflection structure. The electromagnetic reflection structure is between the adhesion structure and the fill structure to reflect electromagnetic radiation.

20 Claims, 23 Drawing Sheets

SEMICONDUCTOR STRUCTURE WITH ISOLATION STRUCTURE

BACKGROUND

Semiconductor devices are used in a multitude of electronic devices, such as mobile phones, laptops, desktops, tablets, watches, gaming systems, and various other industrial, commercial, and consumer electronics. Semiconductor devices may be formed in a semiconductor substrate and may be isolated from other semiconductor devices by an isolation portion. Semiconductor devices may include a charge-coupled device (CCD), complementary metal-oxide-semiconductor (CMOS) radiation detecting elements, and/or other types of radiation detecting elements that are used to convert an image focused on a radiation detecting element into an electrical signal. The semiconductor device may comprise an array of radiation detecting elements, such as photodiodes, configured to produce an electrical signal corresponding to an intensity of radiation impinging on the radiation detecting element. The electrical signal is used to display a corresponding image on a monitor or provide information about the optical image.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
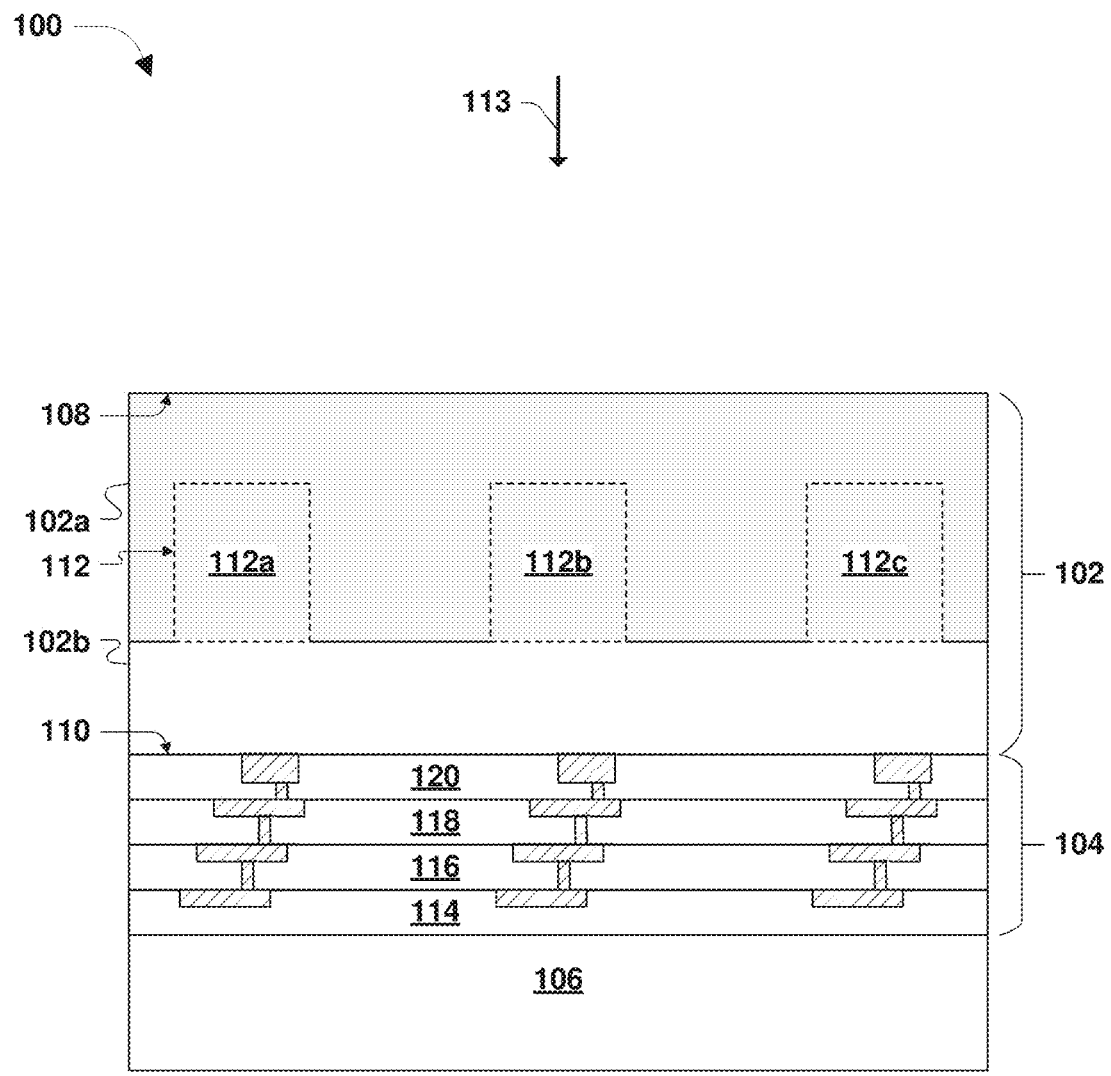
FIGS. 1A-1T are illustrations of a semiconductor arrangement at various stages of fabrication, according to some embodiments.

The following disclosure provides several different embodiments, or examples, for implementing different features of the provided subject matter with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

One or more semiconductor structures and one or more techniques for forming such semiconductor structures are provided herein. According to some embodiments, a semiconductor structure and method of forming a semiconductor structure are provided. In an example, a semiconductor structure comprises a first shallow trench isolation (STI) structure within a semiconductor substrate. The first STI structure may be laterally offset from a semiconductor device, such as a CMOS radiation detecting element, a photodiode, or other type of semiconductor device. The first STI structure may provide a barrier to electromagnetic radiation. For example, the first STI structure may reflect electromagnetic radiation toward the semiconductor device, such as a photodiode. The first STI structure may provide electrical isolation between semiconductor devices, such as a first photodiode and a second photodiode.

According to some embodiments, a semiconductor arrangement comprises a photodiode array formed within a substrate and an STI structure array disposed between and laterally offset from the photodiode array. The photodiode array may comprise one or more photodiodes, such as image sensor pixels, configured to accumulate energy generated by optical radiation, near-infrared (NIR) radiation, or other type of electromagnetic radiation, such as from photons, of an optical image. A voltage of a photodiode can be read as an output for the optical image. In some embodiments, a photodiode is situated under one or more layers or components formed over a substrate. Because radiation travels along a path that comprises such layers or components before reaching the photodiode, signal strength of the radiation can decay before reaching the photodiode or the radiation can travel towards another photodiode. For example, the radiation can be detected by a neighboring or adjacent photodiode, which can result in crosstalk. Crosstalk can degrade performance of the semiconductor arrangement, increase noise, and/or decrease at least one of quality or intensity of signals produced by the semiconductor arrangement. STI structures, as set forth in greater detail herein, may reduce and/or eliminate crosstalk between such photodiodes.

In some embodiments, STI structures, as set forth herein, may improve quantum efficiency (QE) of semiconductor devices, such as photodiodes. In some embodiments, QE refer to a ratio of an incident photon to a converted electron (IPCE) in a photosensitive device, such as a photodiode. For example in a CCD or other photodetector, the QE may refer to a ratio between a number of charge carriers collected at a CCD terminal and a number of photons hitting a CCD photoreactive surface. As a ratio, QE may be dimensionless, but may be related to responsivity of the device, which may be expressed in amps per watt. Energy of a photon is inversely proportional to wavelength. Hence, QE may be measured over a range of different wavelengths to characterize device efficiency at a number of different photon energy levels. In some semiconductor photodiodes, QE may drop to zero for photons having an energy level below a band gap of such photodiode.

According to some embodiments, a semiconductor arrangement may include semiconductor devices such as photodiodes, pinned layer photodiodes, reset transistors, source follower transistors, floating diffusions (also known as floating diodes), transfer transistors, or other types of semiconductor devices. A CMOS semiconductor arrangement may include a CMOS active pixel image sensor (APS) with an intra-pixel charge transfer to a floating diffusion (FD). A pinned photodiode (PPD), also known as a pinned layer photodiode, is an example photodiode structure used in a CCD, a CMOS semiconductor arrangement, or a CMOS APS. A PPD provides, for example, at least one of low noise, high quantum efficiency, or low dark current. A CMOS semiconductor arrangement may be a front side illuminated (FSI) image sensor, detecting radiation from a front side, or a back side illuminated (BSI) image sensor, detecting radiation from a back side.

Accordingly, a semiconductor structure is provided herein. According to some embodiments, the semiconductor structure comprises a first shallow trench isolation (STI) structure within a semiconductor substrate, wherein the first STI structure comprises a buffer structure, an adhesion structure, an electromagnetic reflection structure, and a fill structure. The adhesion structure is between and adhesively bonded to the buffer structure and the electromagnetic reflection structure. The electromagnetic reflection structure is between the adhesion structure and the fill structure to reflect electromagnetic radiation. In some embodiments, the buffer structure comprises an oxide layer formed within a shallow trench of the semiconductor substrate. In some embodiments, the buffer structure is contiguous with a doped region of the semiconductor substrate. In some embodiments, the buffer structure has a buffer sidewall thickness between about 100 Angstroms (Å) to about 500 Å to buffer against dopants of the doped region. In some embodiments, the adhesion structure comprises titanium and is formed as an adhesion layer contiguous with the buffer structure. In some embodiments, the adhesion structure has an adhesion sidewall thickness greater than about 100 Å. In some embodiments, the electromagnetic reflection structure comprises titanium nitride. In some embodiments, the electromagnetic reflection structure is formed as a reflection layer contiguous with the adhesion structure. In some embodiments, the electromagnetic reflection structure has a reflection sidewall thickness greater than the adhesion sidewall thickness. In some embodiments, the reflection sidewall thickness is greater than or equal to three times the adhesion sidewall thickness.

In some embodiments, the buffer structure comprises a first oxide layer formed within a shallow trench of the semiconductor substrate. In some embodiments, the fill structure comprises a second oxide layer that covers a top surface of the adhesion structure, a top surface of the electromagnetic reflection structure, and an inner surface of the electromagnetic reflection structure. In some embodiments, the second oxide layer has a second oxide top layer thickness greater than or equal to 100 Å over the top surface of the adhesion structure and the top surface of the electromagnetic reflection structure. In some embodiments, the first oxide layer has a greater refractive index than the second oxide layer. In some embodiments, the fill structure comprises at least one of silicon dioxide, silicon nitride, silicon oxynitride, hafnium oxide, or fluorinated silica glass. In some embodiments, the buffer structure comprises at least one of aluminum oxide, hafnium oxide, or tantalum nitride. In some embodiments, the adhesion structure comprises a mixture of titanium and a first metal. In some embodiments, the electromagnetic reflection structure comprises a mixture of titanium nitride and a second metal.

In some embodiments, the semiconductor structure comprises a semiconductor device within the semiconductor substrate, wherein the first STI structure is laterally offset from the semiconductor device. In some embodiments, the semiconductor structure comprises a second STI structure within the semiconductor substrate and laterally offset from the semiconductor device, wherein the semiconductor device is between the first STI structure and the second STI structure. In some embodiments, the first STI structure extends into the semiconductor substrate a first depth from a top side of the semiconductor substrate, and the semiconductor device extends into the substrate a second depth, less than the first depth, from the top side of the semiconductor substrate.

According to some embodiments, a semiconductor structure comprises a photodiode within a semiconductor substrate. A first shallow trench isolation (STI) structure is laterally offset from the photodiode within the semiconductor substrate. The first STI structure comprises a buffer structure including a first oxide layer and formed within a shallow trench of the semiconductor substrate. The first STI structure comprises an adhesion structure including titanium and formed as an adhesion layer over the first oxide layer. The first STI structure comprises an electromagnetic reflection structure including titanium nitride and formed as a reflection layer over the adhesion layer. The first STI structure comprises a fill structure including a second oxide layer that covers a top surface of the adhesion structure, a top surface of the electromagnetic reflection structure, and an inner surface of the electromagnetic reflection structure. In some embodiments, the shallow trench has a first trench tapered sidewall tapered toward the photodiode and the buffer structure has a first buffer tapered sidewall that aligns with the first trench tapered sidewall. In some embodiments, the adhesion structure has a first adhesion tapered sidewall that aligns with the first buffer tapered sidewall and the electromagnetic reflection structure has a first reflection tapered sidewall that aligns with the first adhesion tapered sidewall.

One or more methods of forming a semiconductor structure are provided herein. According to some embodiments, a buffer structure comprising a first oxide layer is formed in a shallow trench of a semiconductor substrate. An adhesion structure comprising titanium is formed over the buffer structure, wherein the adhesion structure has an adhesion sidewall thickness. An electromagnetic reflection structure comprising titanium nitride is formed over the adhesion structure, wherein the electromagnetic reflection structure has a reflection sidewall thickness greater than or equal to three times the adhesion sidewall thickness. A fill structure comprising a second oxide layer is formed that covers a top surface of the adhesion structure, a top surface of the electromagnetic reflection structure, and an inner surface of the electromagnetic reflection structure.

Figure 1B:
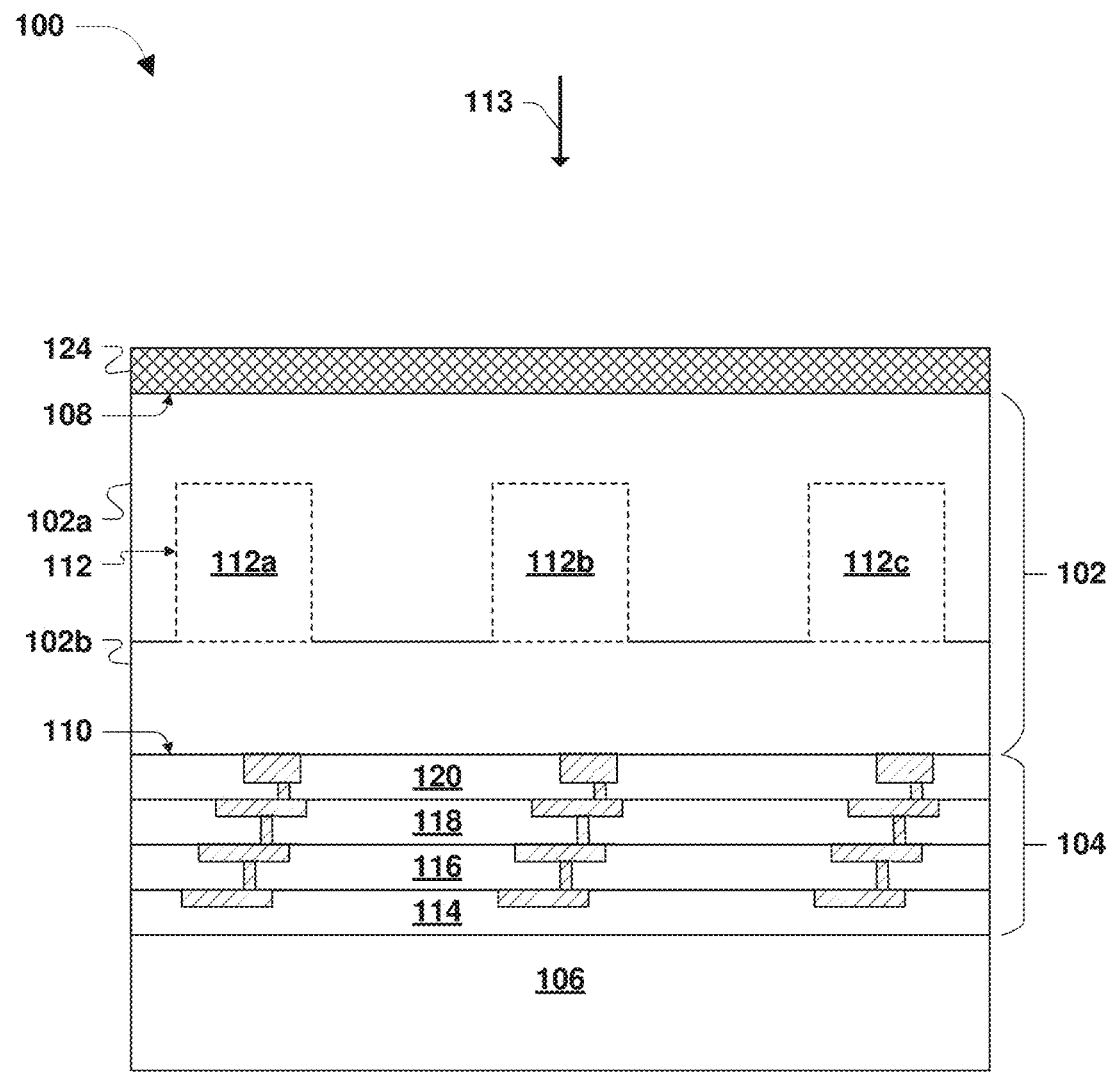
Figure 1C:
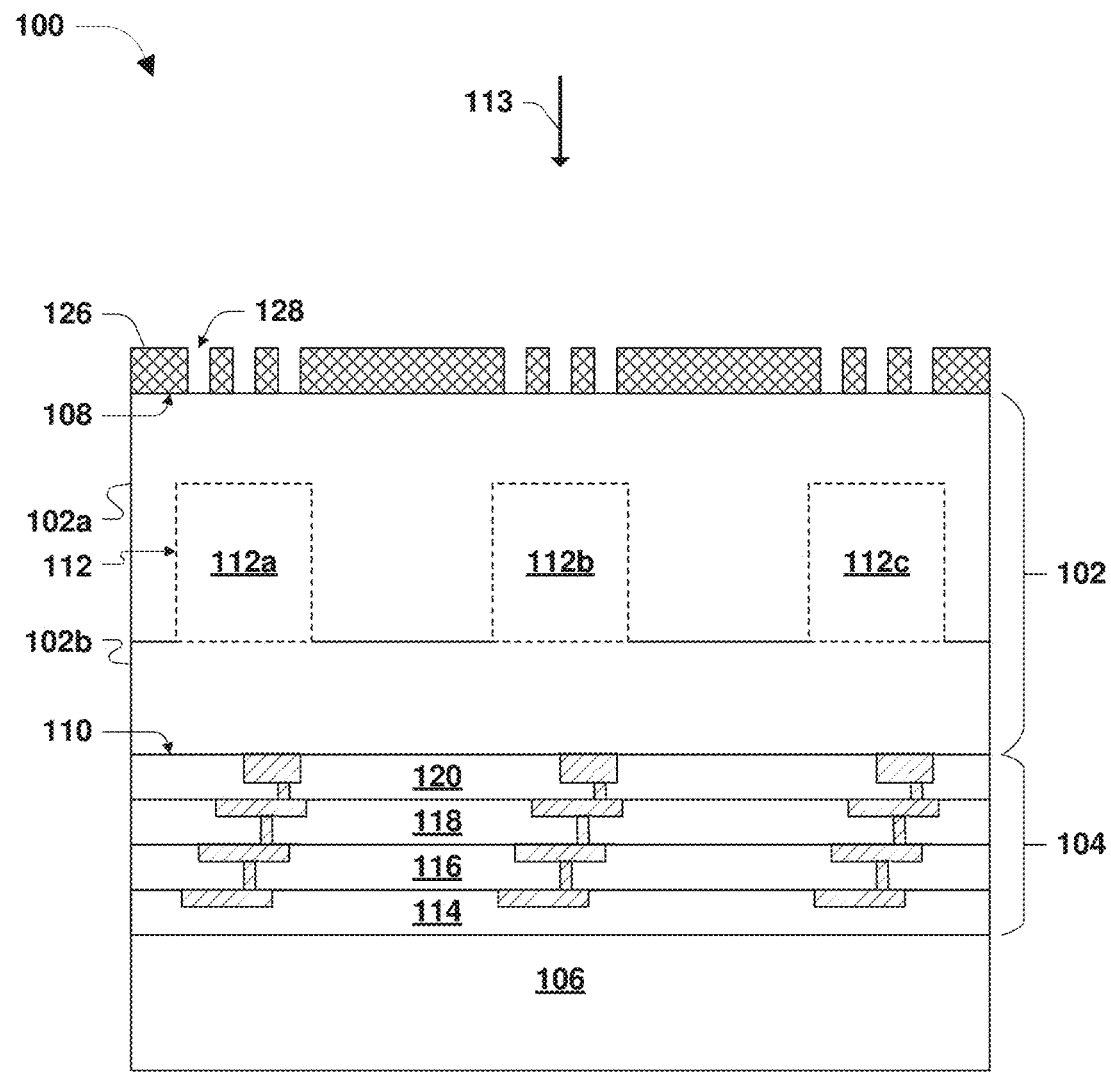
Figure 1D:
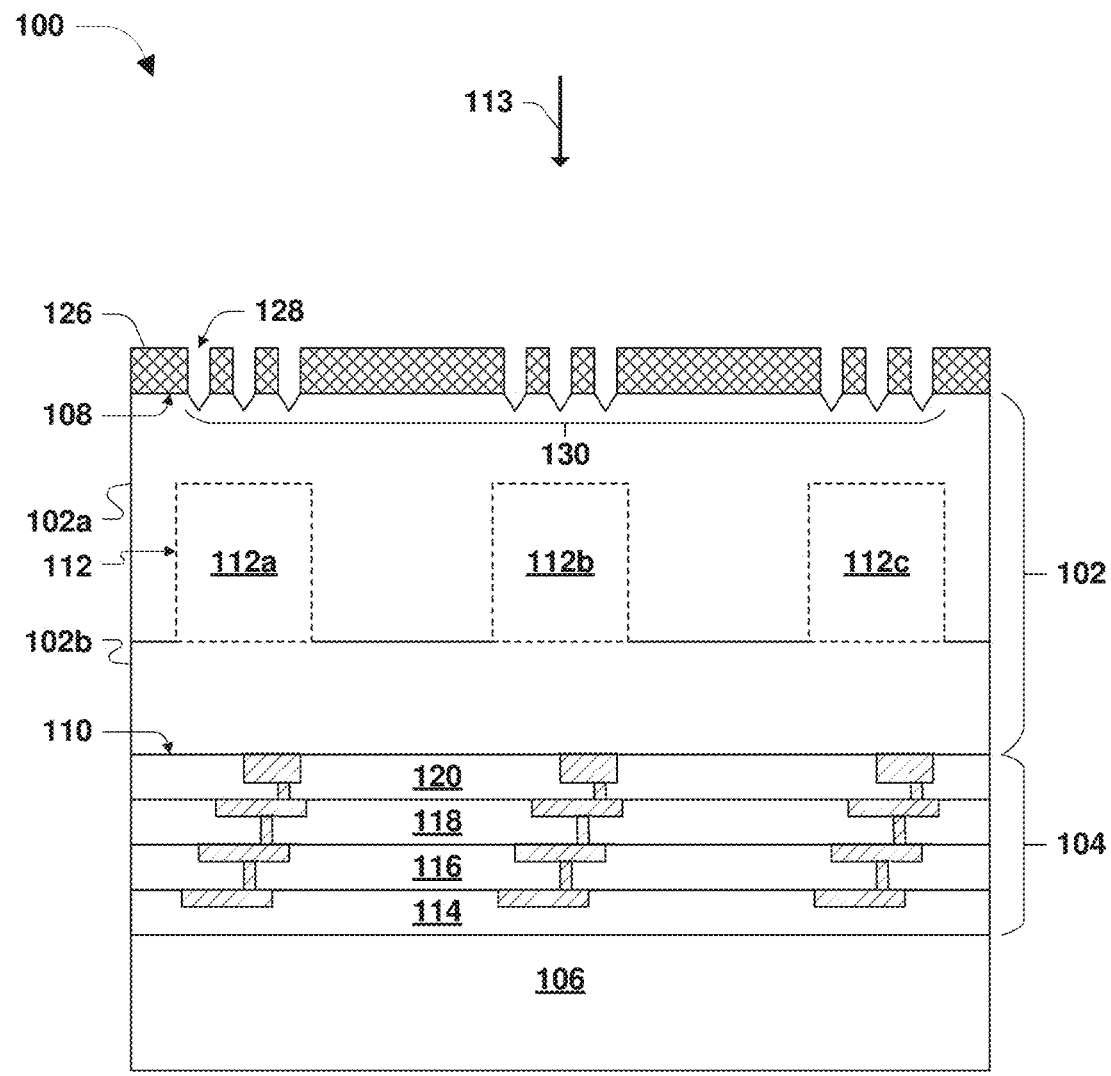
Figure 1E:
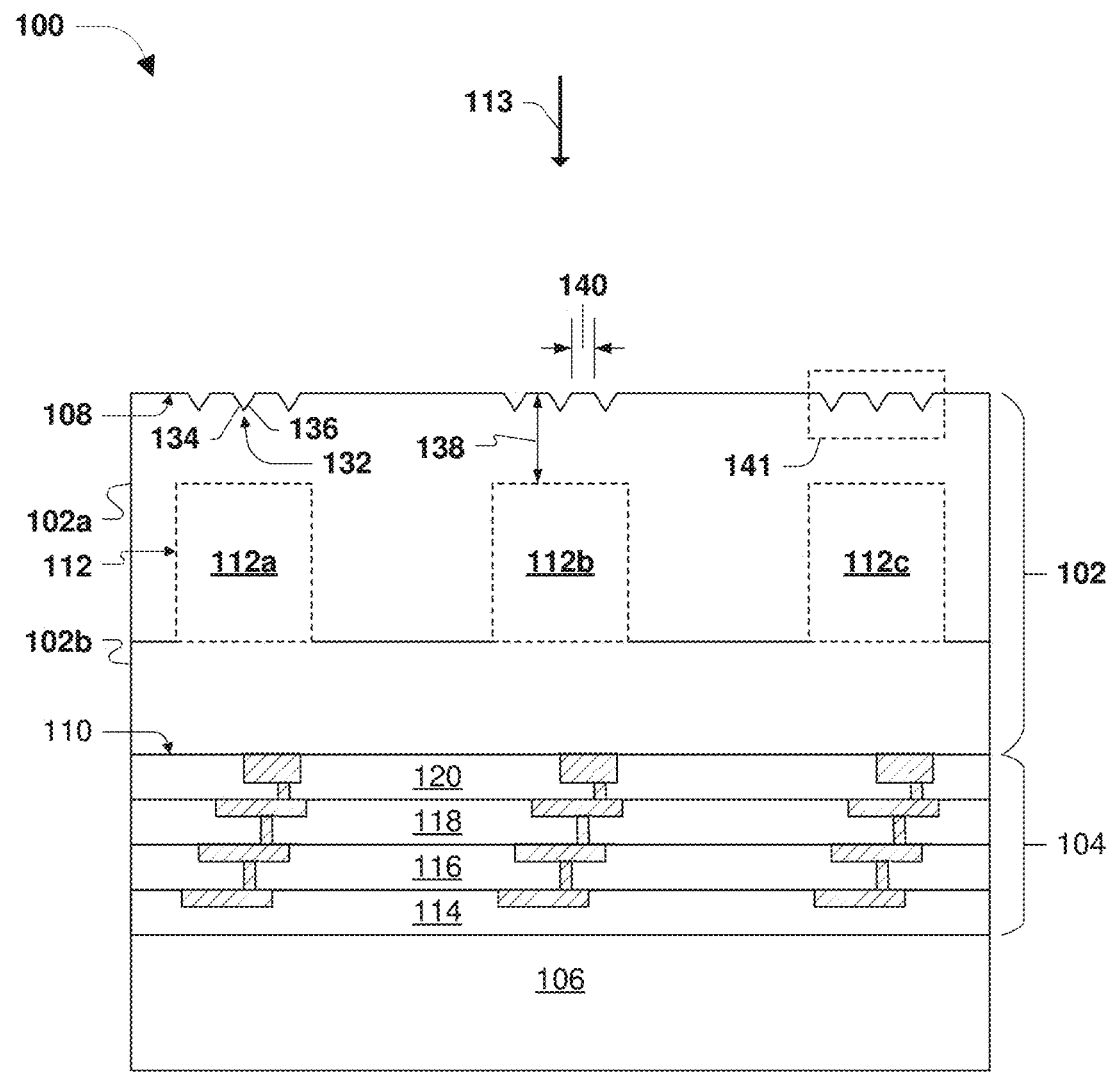
Figure 1F:
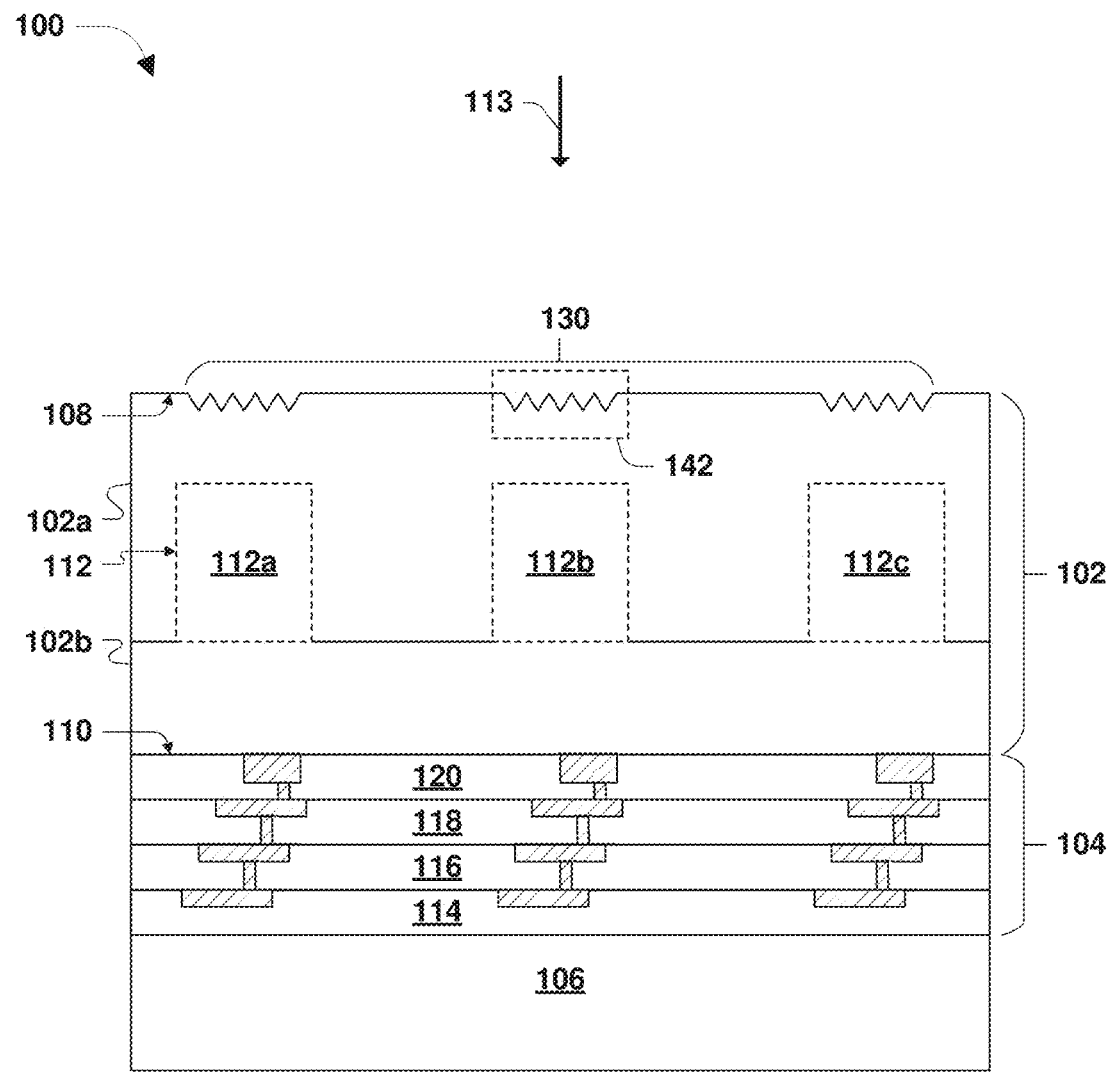
Figure 1G:
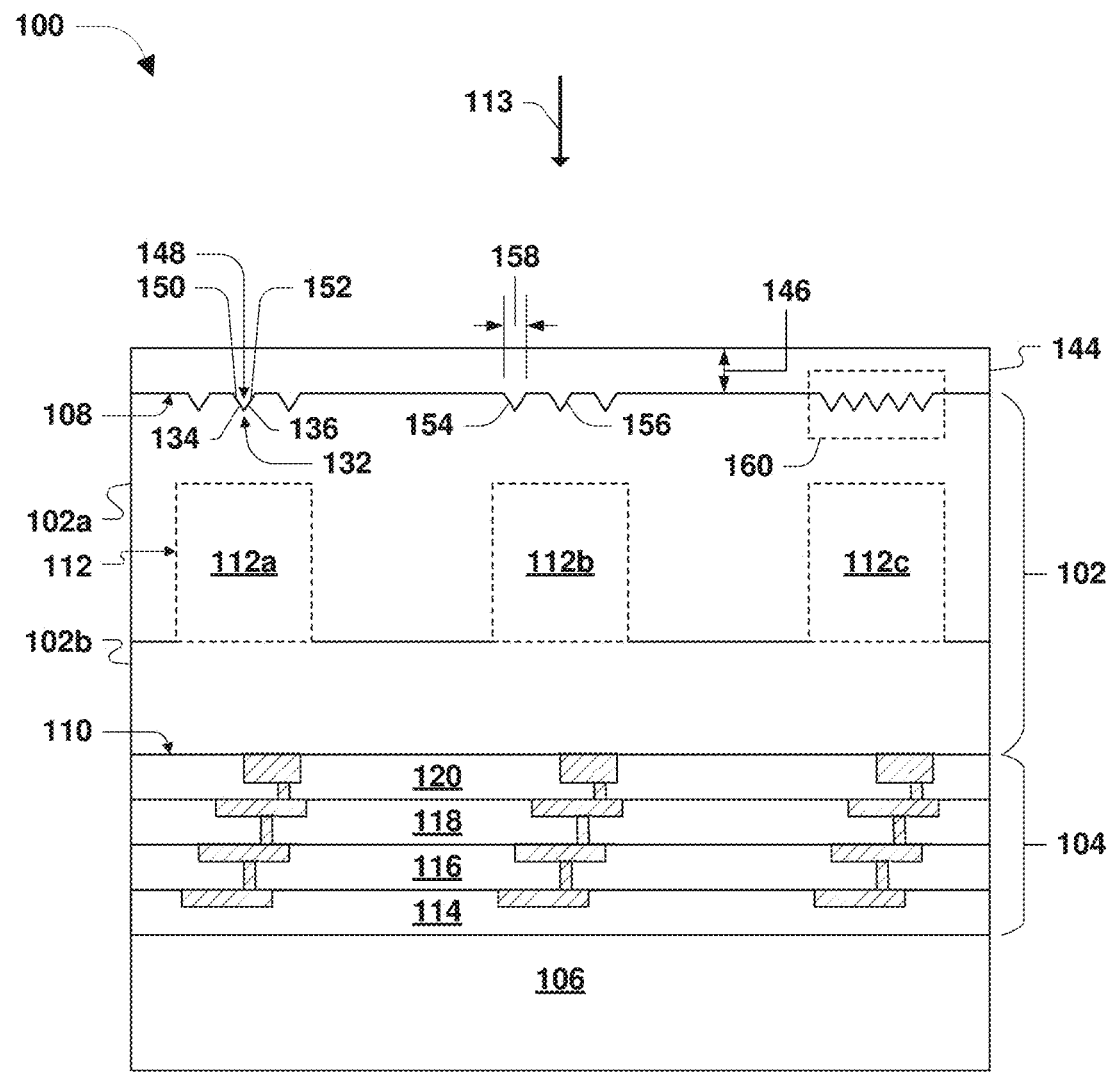
Figure 1H:
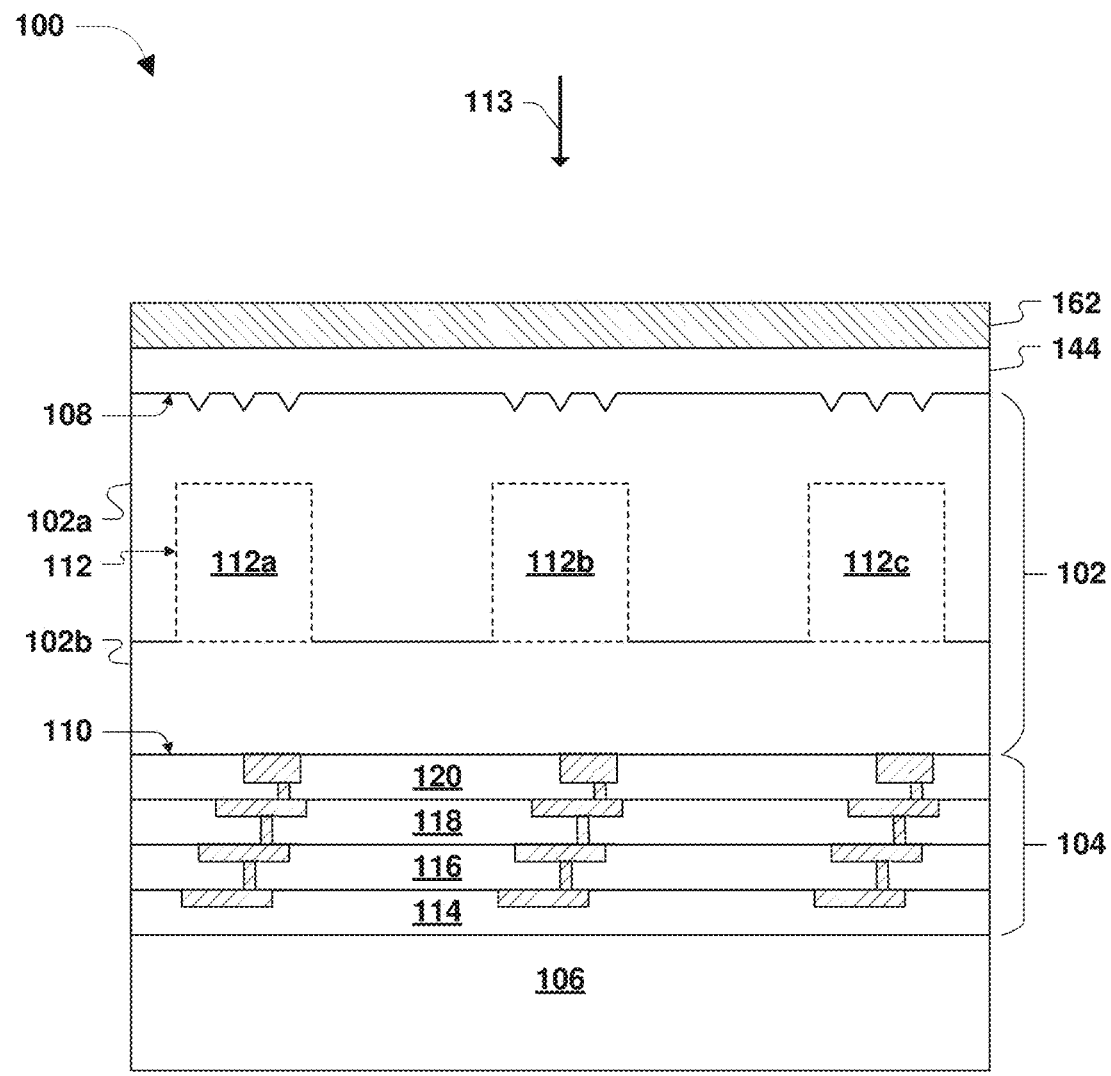
Figure 1I:
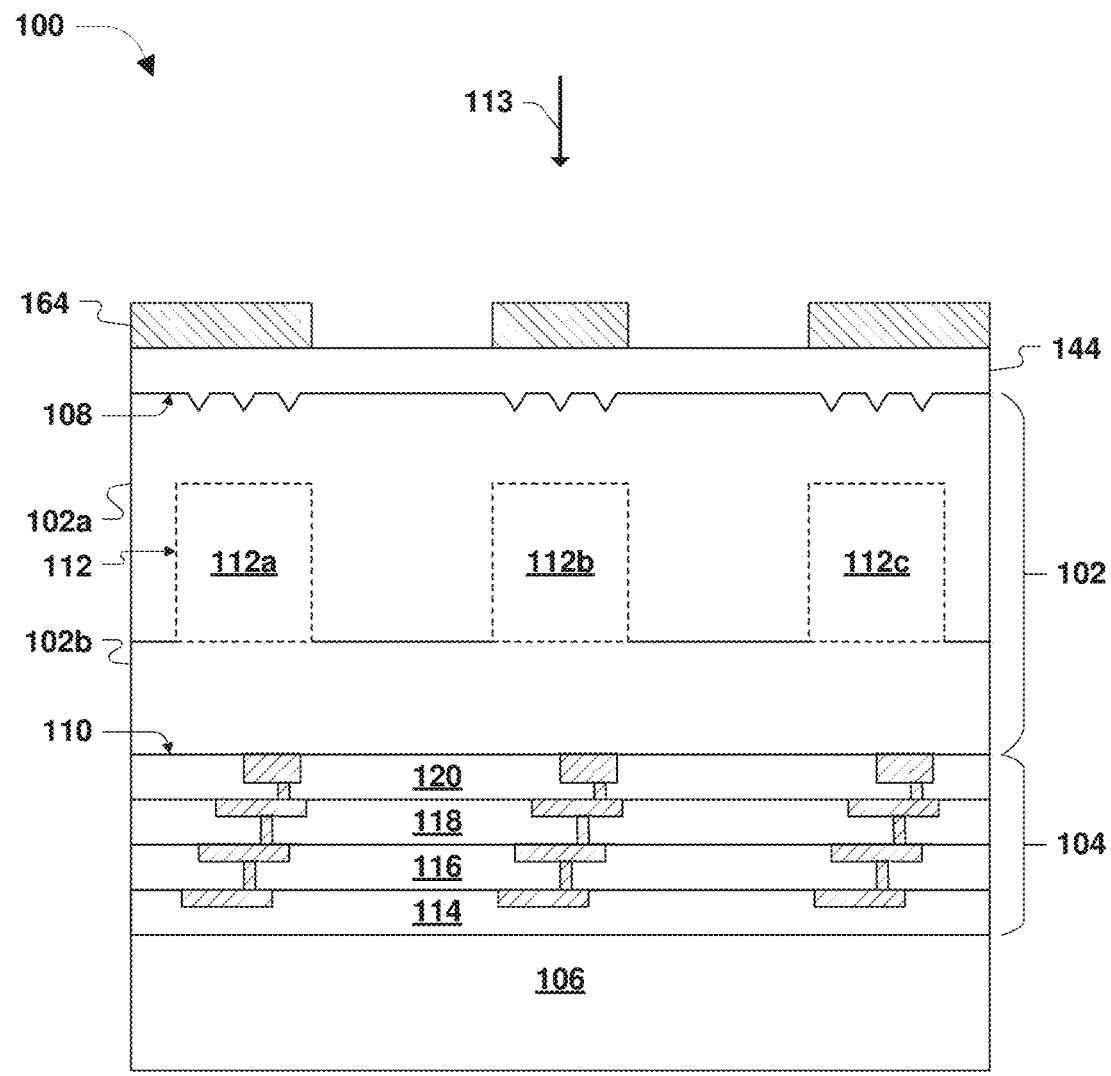
Figure 1J:
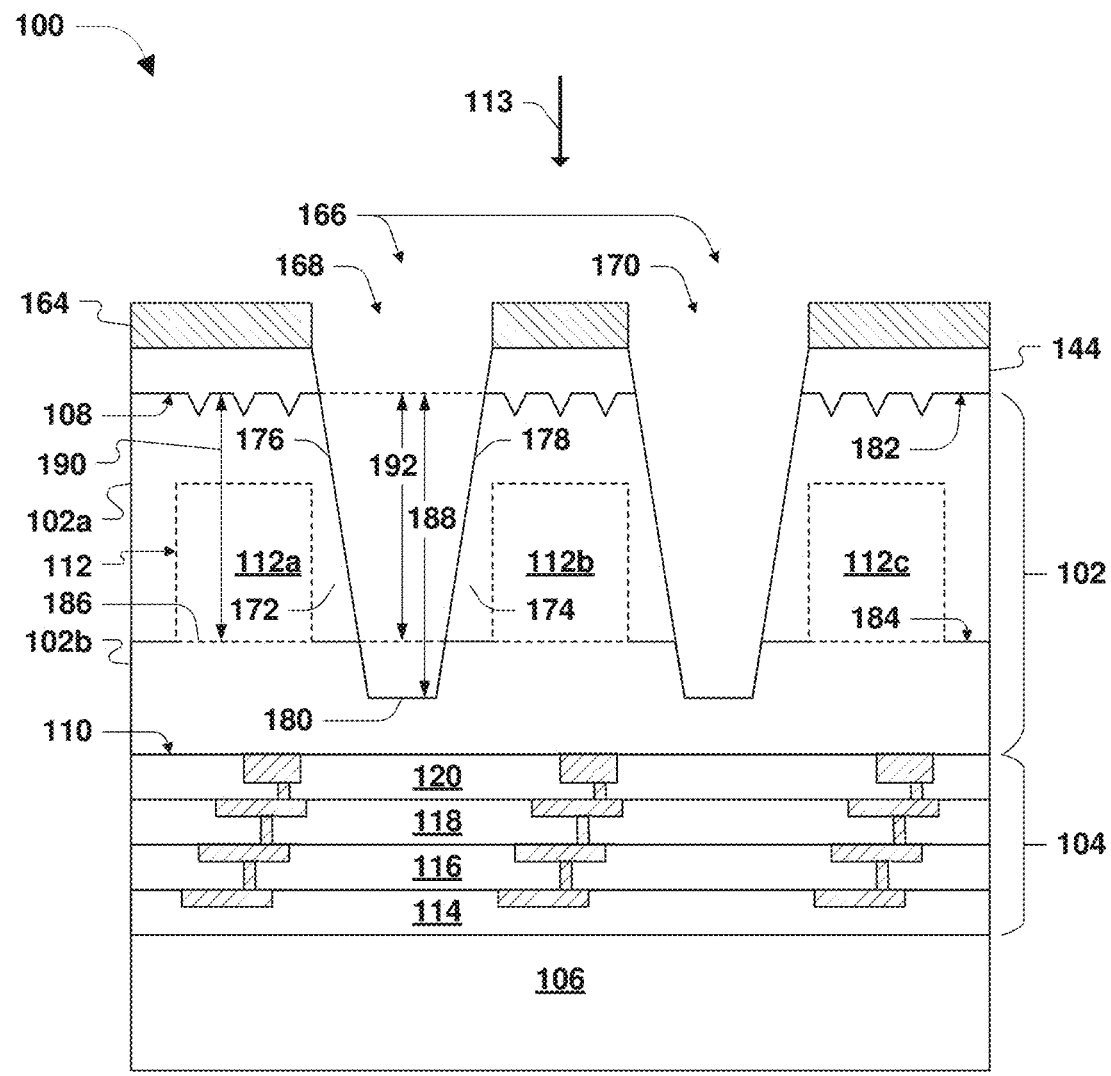
Figure 1K:
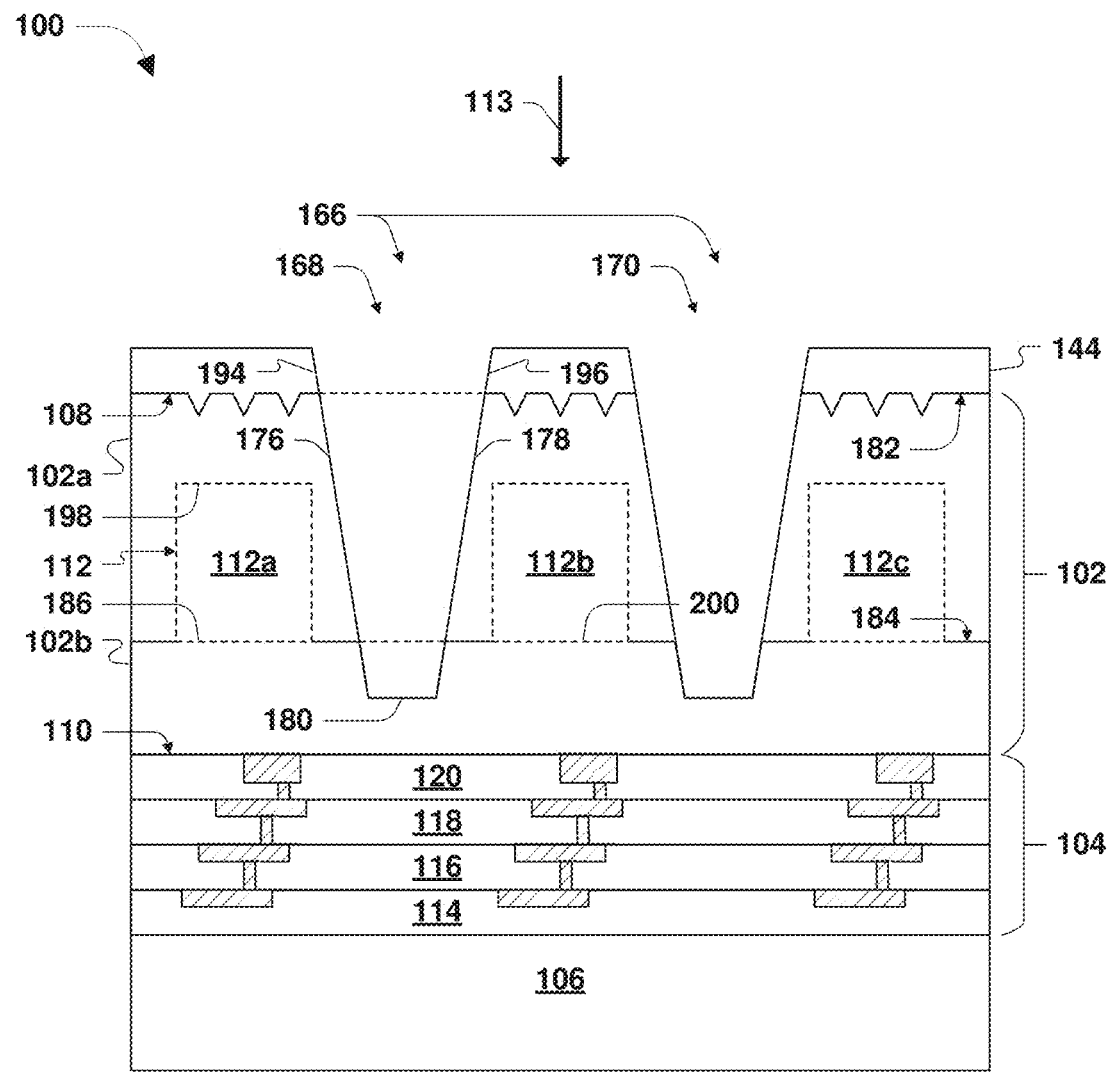
Figure 1L:
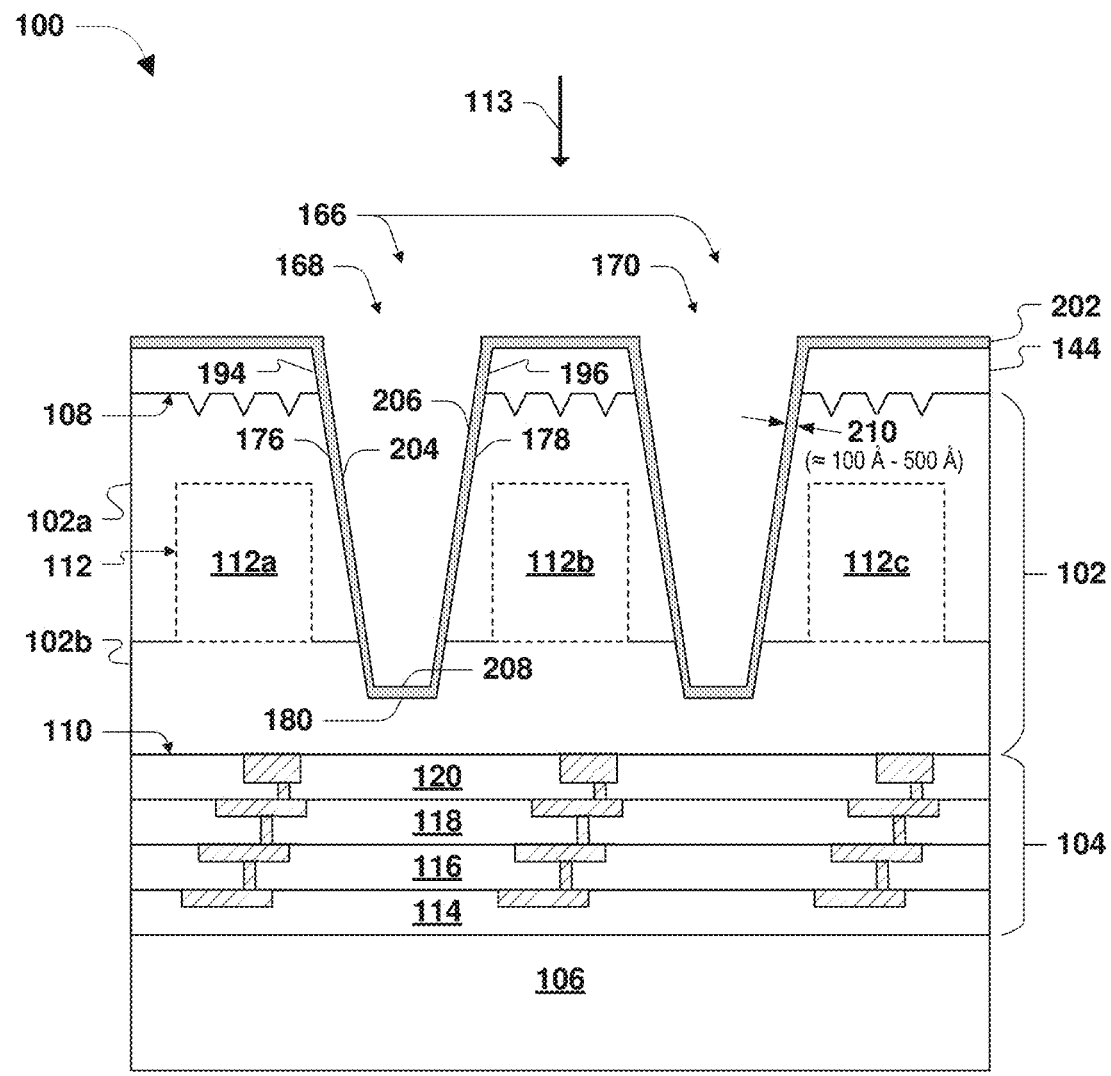
Figure 1M:
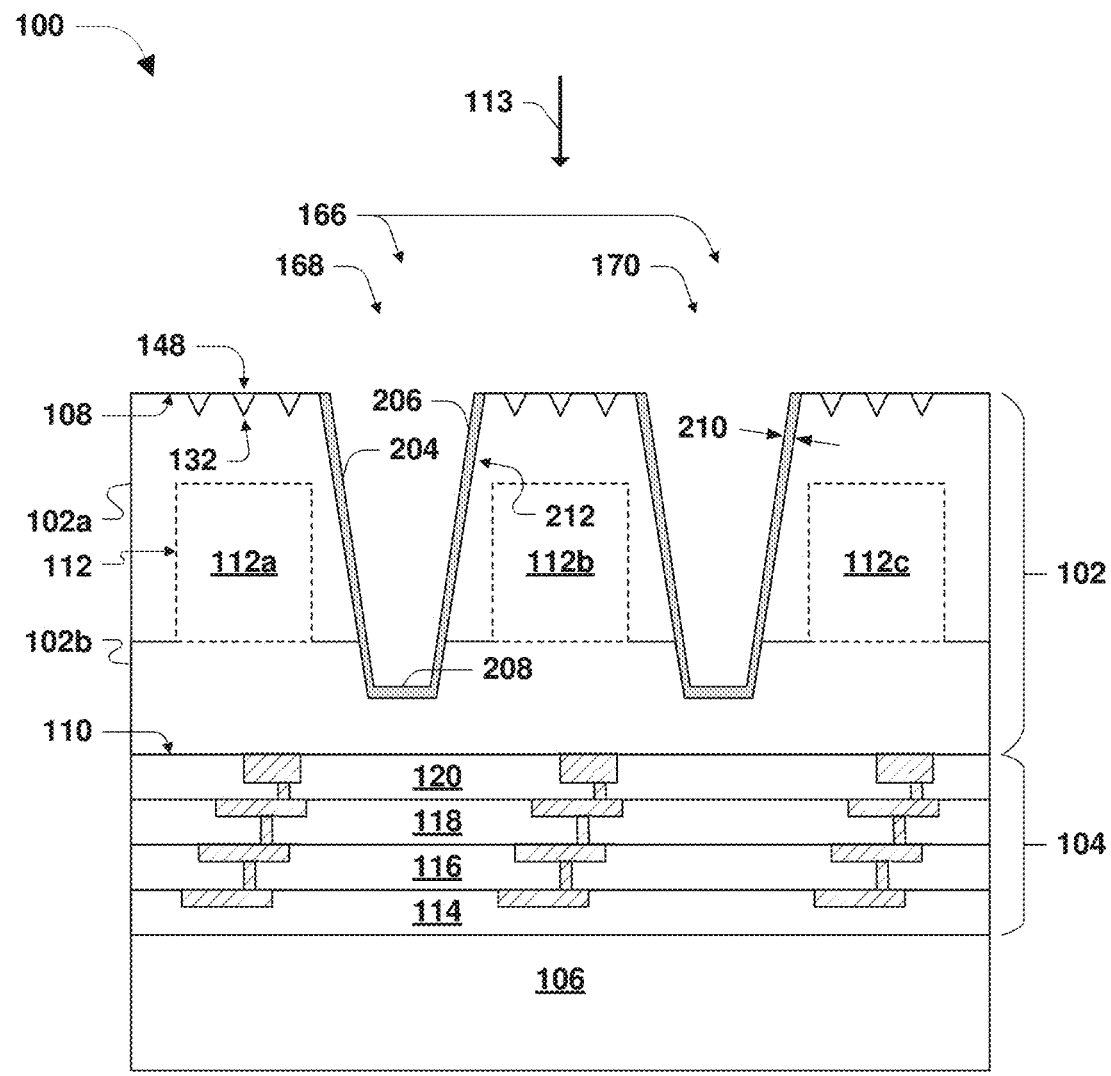
Figure 1N:
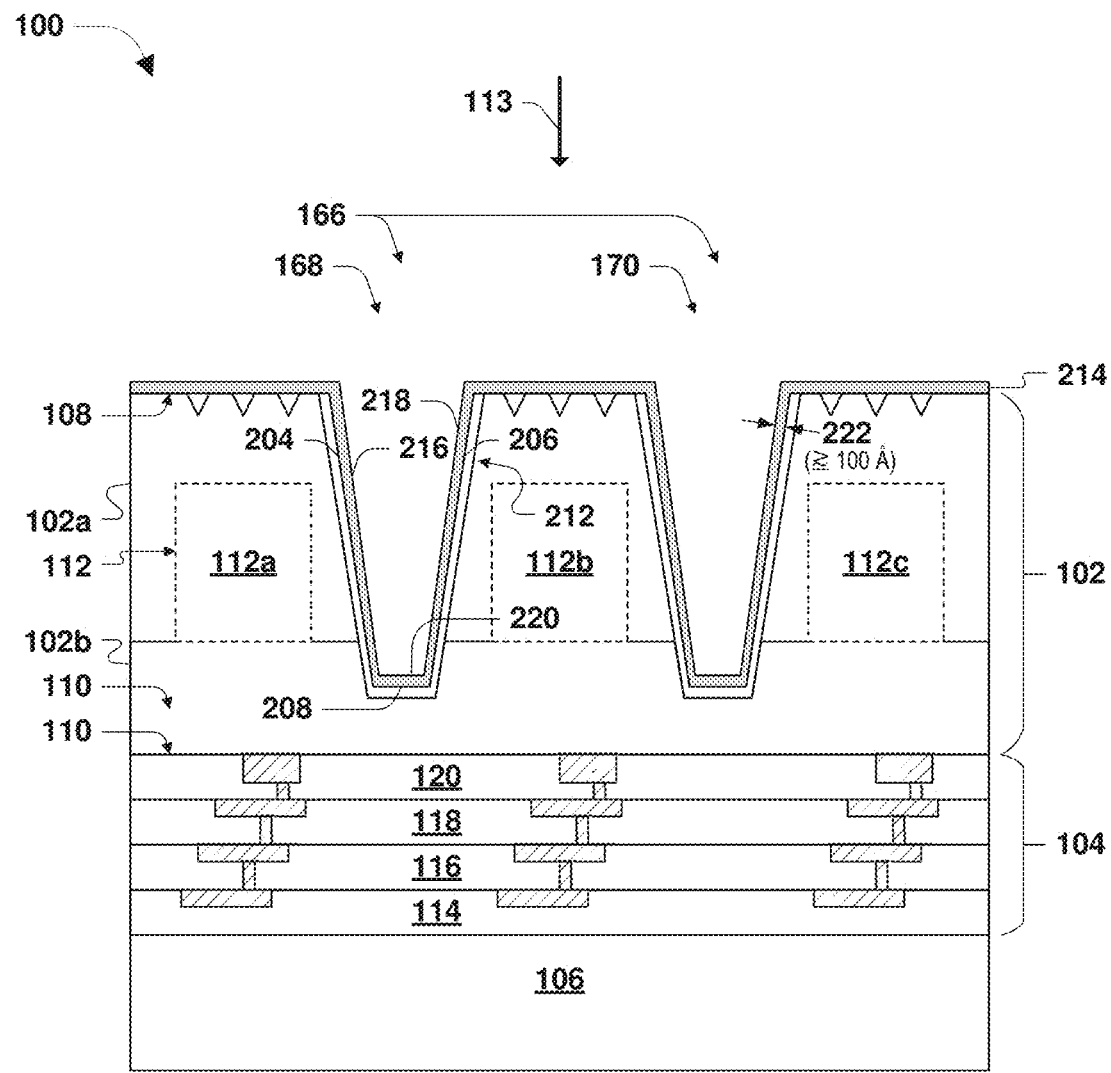
Figure 1O:
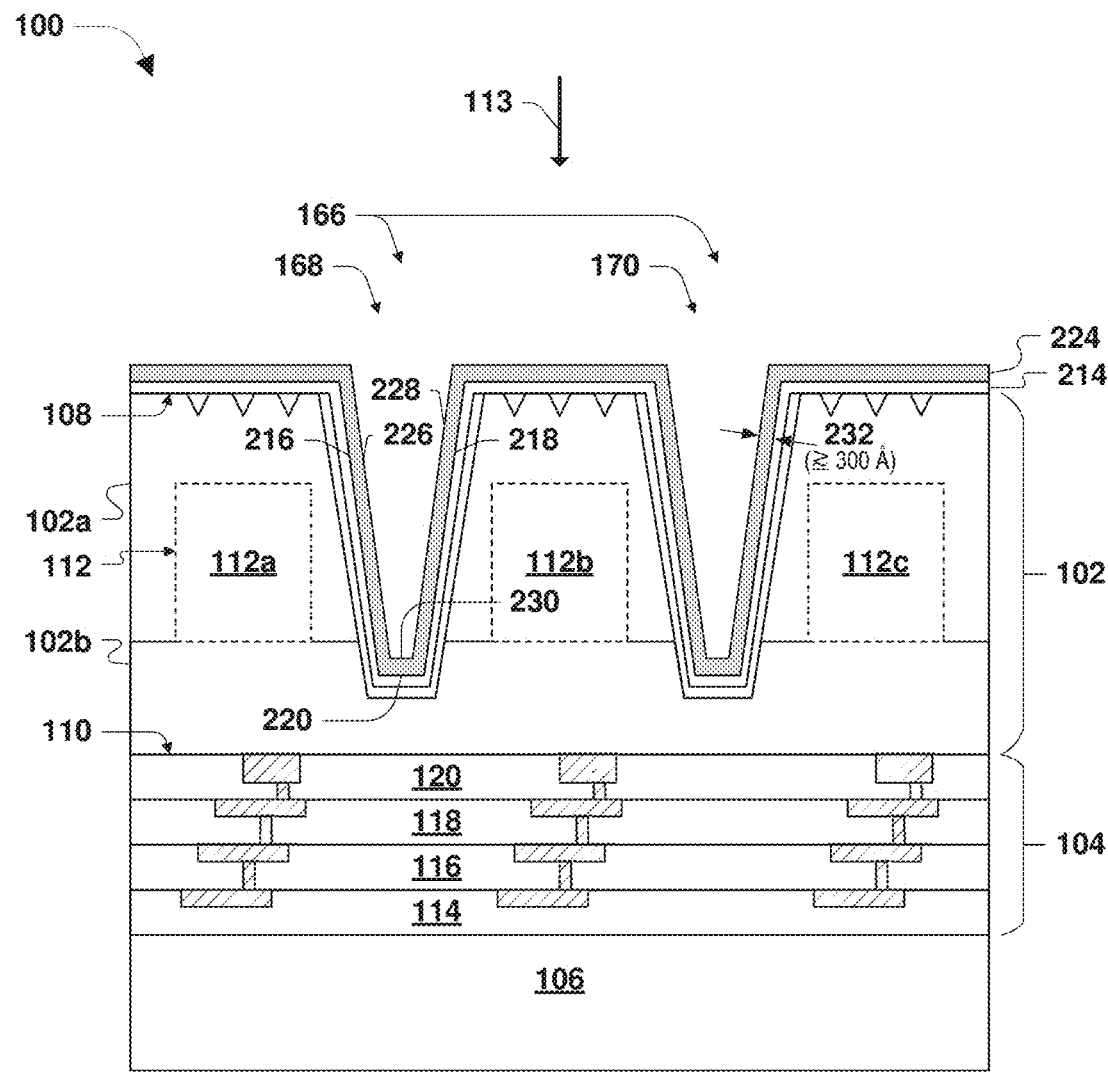
Figure 1P:
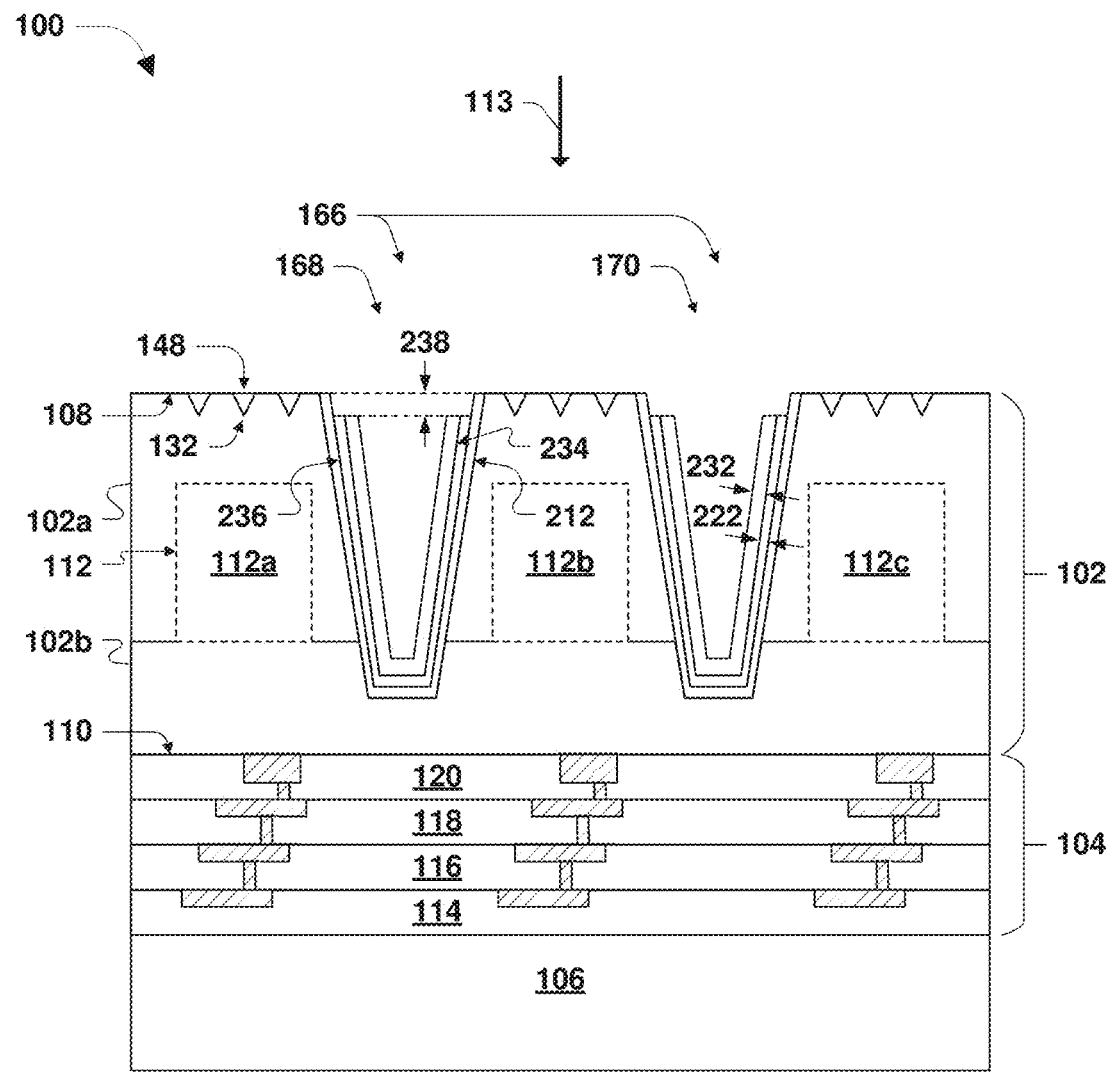
Figure 1Q:
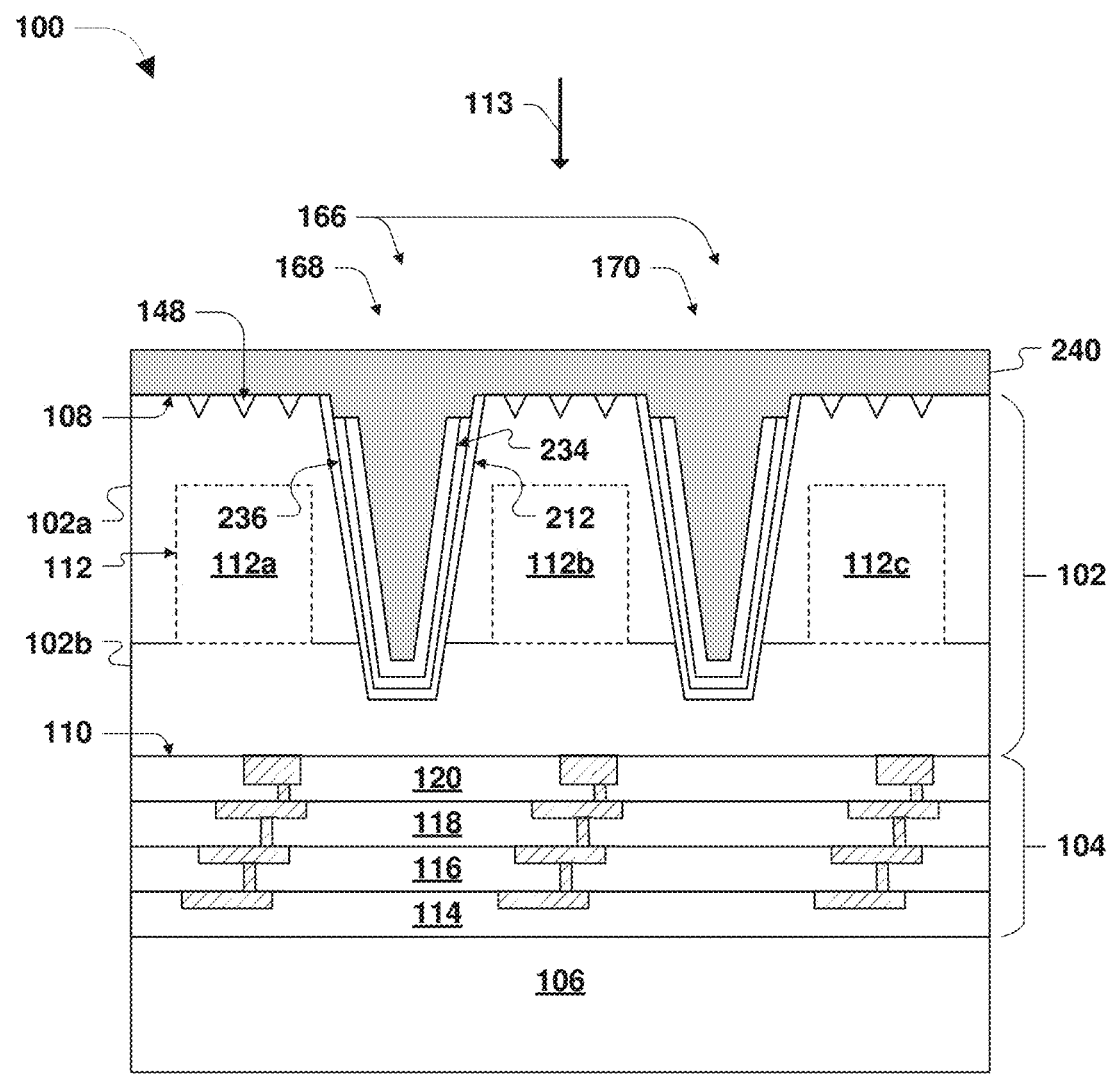
Figure 1R:
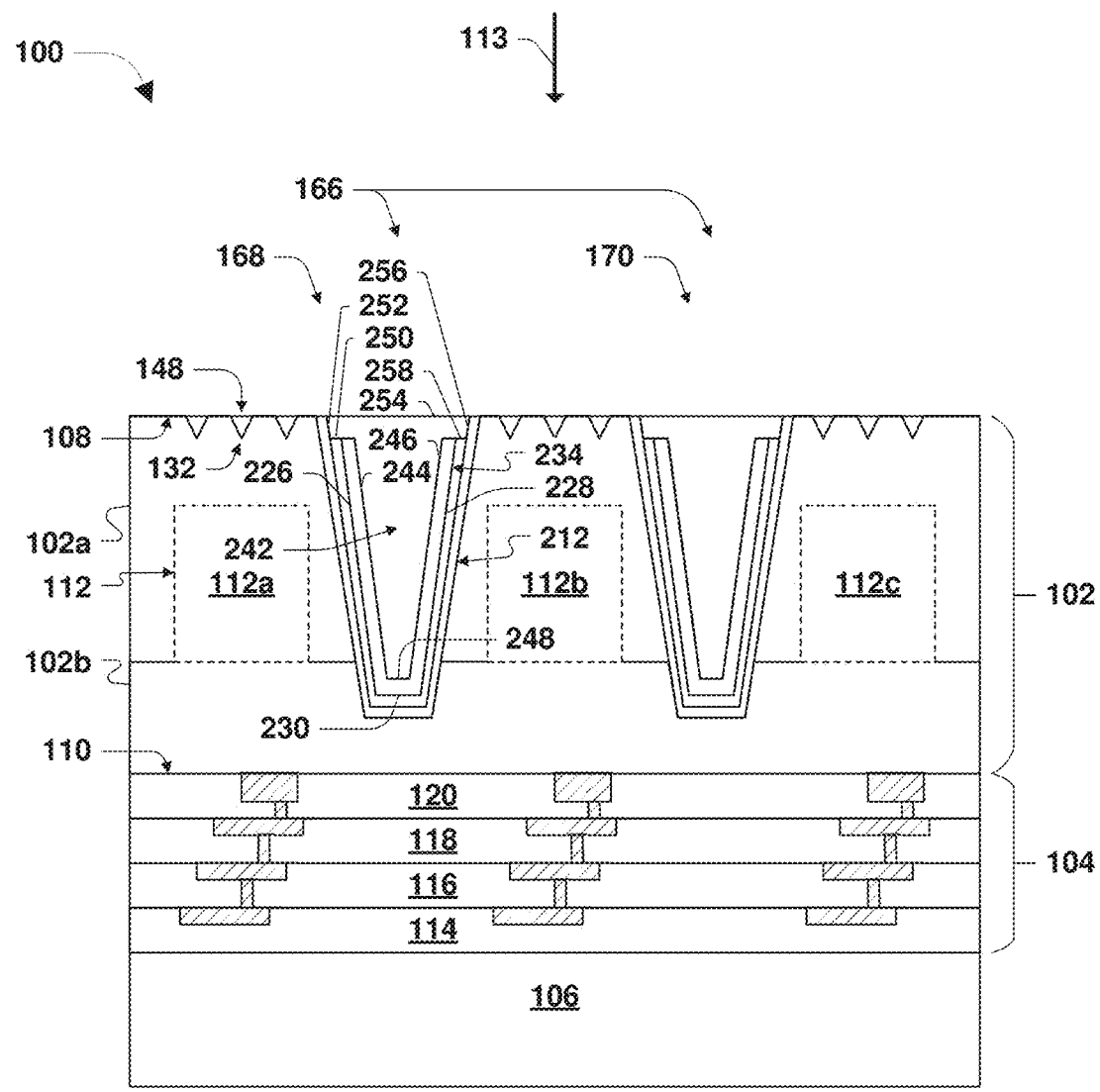
Figure 1S:
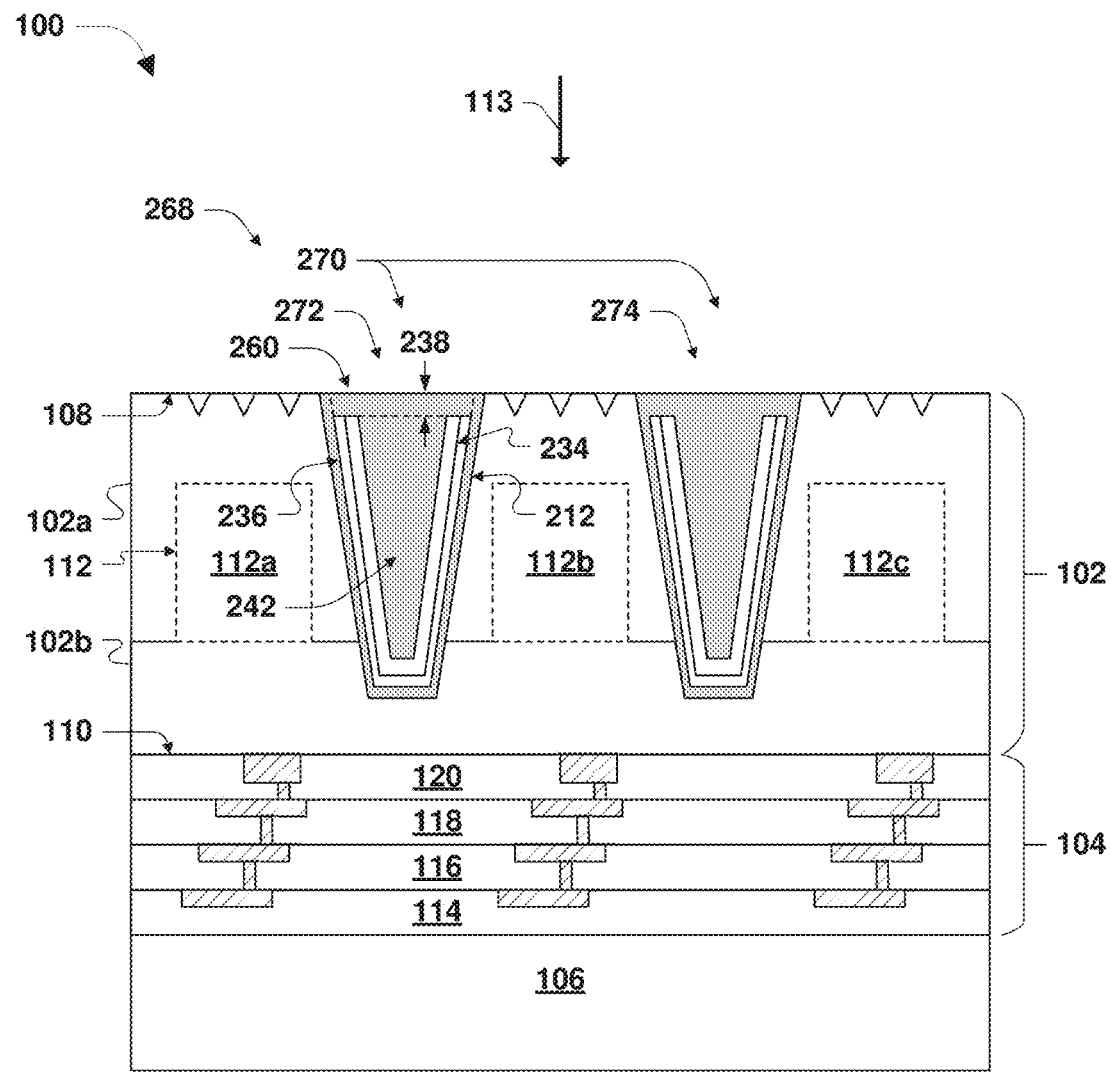
Figure 1T:
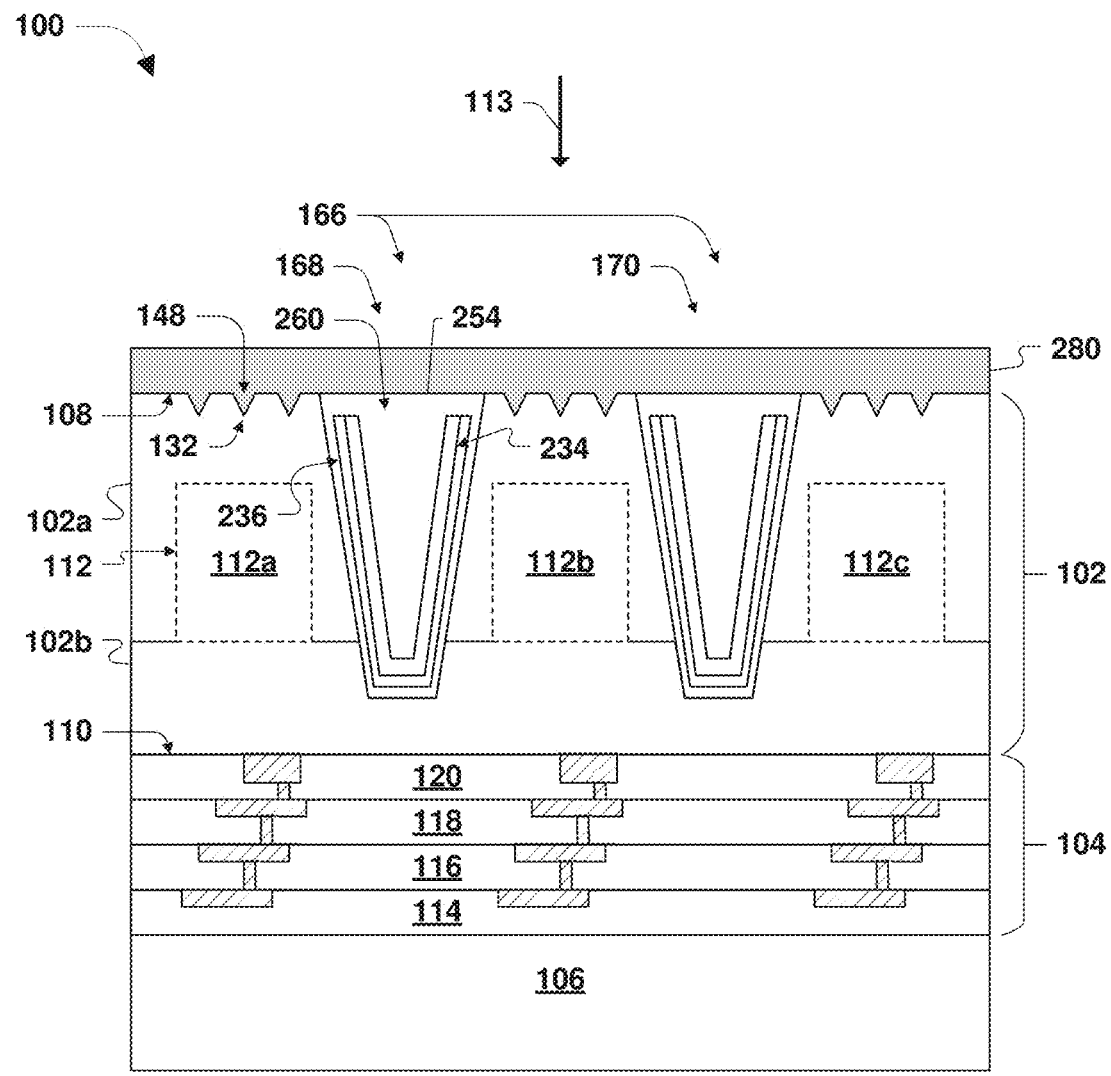

FIGS. 1A-1T are illustrations of a semiconductor arrangement 100 at various stages of fabrication, according to some embodiments. FIGS. 1A-1T illustrate cross-sectional views of the semiconductor arrangement 100. The semiconductor arrangement 100 comprises a semiconductor substrate 102, an interconnect structure 104, and a second substrate 106. In some embodiments, the semiconductor substrate 102 corresponds to a device wafer of the semiconductor arrangement 100 and the second substrate 106 to a carrier wafer of the semiconductor arrangement 100. The semiconductor substrate 102 has a top side 108 and a bottom side 110, where the top side 108 corresponds to a first side of the semiconductor substrate 102 and the bottom side 110 corresponds to a second side of the semiconductor substrate 102.

The semiconductor substrate 102 comprises at least one of an epitaxial layer, a silicon-on-insulator (SOI) structure, a wafer, or a die formed from a wafer. For example, the epitaxial layer may comprise a deposition of an overlayer on a crystalline substrate, where the overlayer is in registry with the semiconductor substrate 102. In some embodiments, the epitaxial layer may comprise a type of crystal growth or material deposition in which new crystalline layers are formed with one or more well-defined orientations with respect to a crystalline seed layer of the semiconductor substrate 102. The semiconductor substrate 102 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. The semiconductor substrate 102 comprises at least one of monocrystalline silicon, crystalline silicon with a <100> crystallographic orientation, crystalline silicon with a <110> crystallographic orientation, crystalline silicon with a <111> crystallographic orientation or other suitable material.

In some embodiments, the semiconductor substrate 102 has at least one of a doped region 102a, such as an n-type doped region or a p-type doped region, and a second region 102b, such as a non-doped region or a different type of doped region than the doped region 102a. An n-type doped region may be formed by doping the semiconductor substrate 102 with an electron donor element. In n-type semiconductors, electrons are majority charge carriers and holes are minority charge carriers. In an n-type doped region, the Fermi level is greater than the Fermi level of the intrinsic semiconductor base material and lies closer to the conduction band than the valence band. In some embodiments, a dopant for n-type silicon comprises phosphorus, arsenic, or other material that creates electrons as majority charge carriers. A p-type doped region may be formed by doping the semiconductor substrate 102 with an electron acceptor element. In p-type semiconductors, positive charges, also known as electron holes, are the majority charge carriers and electrons are the minority charge carriers. In some embodiments, p-type semiconductors may have a larger hole concentration than electron concentration. In a p-type doped region, the Fermi level is below the intrinsic semiconductor base material and lies closer to the valence band than the conduction band. In some embodiments, a dopant for p-type silicon is boron, gallium, or other material that creates electron holes as majority charge carriers. Other structures and/or configurations of the semiconductor substrate 102 are within the scope of the present disclosure.

In some embodiments, the semiconductor arrangement 100 comprises semiconductor devices 112 in the semiconductor substrate 102, such as first semiconductor device 112a, second semiconductor device 112b, and third semiconductor device 112c, as illustrated. The semiconductor devices 112 are formed by at least one of doping, ion implantation, molecular diffusion, or other suitable techniques. In some embodiments, the semiconductor devices 112 are configured to sense radiation, such as incident light, which is projected towards the semiconductor substrate 102 along direction 113. In some embodiments, the semiconductor devices 112 comprise photodiodes, such as at least one of pinned layer photodiodes, phototransistors, photogates, or other suitable components. In some embodiments, the semiconductor devices 112 are formed before, during, and/or after formation of other structures or components, described in greater detail herein. At least some of semiconductor devices 112 can vary from one another to have at least one of different heights, thicknesses, widths, material compositions, etc. Any number of semiconductor devices 112 in the semiconductor substrate 102 are contemplated.

At least some of the semiconductor devices 112 comprise at least one of germanium, indium, phosphorous, $BF_2$, arsenic, antimony, fluorine, InAs, InSb, GaSb, GaAs, InP, a silicide, or other suitable material. In some embodiments, the semiconductor devices 112 are configured to sense radiation, such as incident light, which is projected towards the semiconductor substrate 102. The sensed radiation may be projected along the direction 113, at an angle to the direction 113, or a combination thereof. The sensed radiation may be incident at the top side 108 of the semiconductor substrate 102 before being sensed by one of the semiconductor devices 112. At least some of the semiconductor devices 112 can comprise a material that is relatively highly absorptive to optical wavelengths of radiation. Optical radiation, also known as visible radiation, may comprise wavelengths from about 420 nanometers (nm) to about 680 nm or from about 380 nm to about 800 nm. White radiation is generally a combination of all optical radiation. According to some embodiments, optical radiation comprises red radiation (e.g., generally a red range of wavelengths from about 620 nm to about 700 nm), green radiation (e.g., generally a green range of wavelengths from about 492 nm to about 577 nm), blue radiation (e.g., generally a blue range of wavelengths from about 455 nm to about 492 nm), and white radiation (e.g., generally a white range of wavelengths from about 380 nm to about 800 nm). At least some of the semiconductor devices 112 may comprise a material that is relatively highly absorptive to near-infrared (NIR) wavelengths, such as radiation having a wavelength range from about 750 nm to about 1400 nm or may comprise an NIR range of wavelengths from about 780 nm to about 2500 nm. Other structures and/or configurations of the semiconductor devices 112 are within the scope of the present disclosure.

The interconnect structure 104 comprises one or more interconnect layers, such as at least one of a first interconnect layer 114, a second interconnect layer 116, a third interconnect layer 118, or a fourth interconnect layer 120. The one or more interconnect layers of the interconnect structure 104 comprise patterned dielectric layers and/or conductive layers that provide interconnections, such as wiring, between at least one of various doped features, circuitry, input/output, etc. of the semiconductor arrangement 100. In some embodiments, the interconnect structure 104 comprises an interlayer dielectric and multilayer interconnect structures, such as at least one of contacts, vias, metal lines, or other type of structure. Other structures and configurations of the interconnect structure 104 are within the scope of the present disclosure. For purposes of illustration, the interconnect structure 104 comprises conductive lines, where the positioning and configuration of such conductive lines might vary depending upon design needs. The interconnect structure 104 at least one of overlies the semiconductor substrate 102, is in direct contact with the semiconductor substrate 102, or is in indirect contact with the semiconductor substrate 102.

The second substrate 106 comprises at least one of an epitaxial layer, a SOI structure, a wafer, or a die formed from a wafer. The second substrate 106 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. The second substrate 106 comprises at least one of monocrystalline silicon, crystalline silicon with a <100> crystallographic orientation, crystalline silicon with a <110> crystallographic orientation, crystalline silicon with a <111> crystallographic orientation or other suitable material. In some embodiments, the second substrate 106 comprises at least one doped region. Other structures and/or configurations of the second substrate 106 are within the scope of the present disclosure.

In some embodiments, the second substrate 106 is bonded with the interconnect structure 104, such as by at least one of one or more bonding layers, an adhesive, a bonding process, or other suitable techniques. In some embodiments where the second substrate 106 is bonded with the interconnect structure 104 using the one or more bonding layers, the one or more bonding layers are between the second substrate 106 and the interconnect structure 104. The second substrate 106 at least one of overlies the interconnect structure 104, is in direct contact with the interconnect structure 104, or is in indirect contact with the interconnect structure 104.

In some embodiments, one or more components of the semiconductor arrangement 100 are formed through an inversion operation. An inversion operation may be performed such that the semiconductor substrate 102 lies beneath at least one of the interconnect structure 104 or the second substrate 106 during formation of one or more components, such as the semiconductor devices 112. For example, during formation of the interconnect structure 104, the top side 108 of the semiconductor substrate 102 corresponds to a back side the semiconductor substrate 102, and the bottom side 110 of the semiconductor substrate 102 corresponds to a front side of the semiconductor substrate 102. In some embodiments, a portion of the semiconductor substrate 102 on the top side 108 of the semiconductor substrate 102 is removed, such as after the inversion operation, to reduce a thickness of the semiconductor substrate 102.

FIG. 1B illustrates a mask layer 124 formed over the semiconductor substrate 102, according to some embodiments. The mask layer 124 at least one of overlies the semiconductor substrate 102, is in direct contact with the semiconductor substrate 102, or is in indirect contact with the semiconductor substrate 102. In some embodiments, the mask layer 124 is a hard mask layer. The mask layer 124 comprises at least one of oxide, nitride, a metal, or other suitable material. The mask layer 124 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. Other structures and/or configurations of the mask layer 124 are within the scope of the present disclosure.

FIG. 1C illustrates the mask layer 124 patterned to form a patterned mask layer 126 over the semiconductor substrate 102, according to some embodiments. According to some embodiments, a photoresist (not shown) is used to form the patterned mask layer 126. The photoresist is formed over the mask layer 124 by at least one of PVD, sputtering, CVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer.

An etching process, used to remove portions of the mask layer 124 to form the patterned mask layer 126, is at least one of a dry etching process, a wet etching process, an anisotropic etching process, an isotropic etching process or another suitable etching process. The etching process uses at least one of HF, diluted HF, $HCl_2$, $H_2S$, or other suitable material. In some embodiments, the etching process, which is performed to remove portions of the mask layer 124 and form the patterned mask layer 126, also removes at least some of the semiconductor substrate 102, such as portions of the semiconductor substrate 102 underlying openings 128 in the patterned mask layer 126. Other processes and/or techniques for forming the patterned mask layer 126 are within the scope of the present disclosure.

FIG. 1D illustrates use of the patterned mask layer 126 to form one or more recesses 130 in the semiconductor substrate 102, according to some embodiments. In some embodiments, an etching process is performed to form the recesses 130, where the openings 128 in the patterned mask layer 126 allow one or more etchants applied during the etching process to remove portions of the semiconductor substrate 102 while the patterned mask layer 126 protects or shields portions of the semiconductor substrate 102 that are covered by the patterned mask layer 126. The etching process is at least one of a dry etching process, a wet etching process, an anisotropic etching process, an isotropic etching process, or another suitable etching process. The etching process uses at least one of HF, diluted HF, $HCl_2$, $H_2S$, or other suitable material. Other processes and/or techniques for forming the recesses 130 are within the scope of the present disclosure.

In some embodiments, one or more of the recesses 130 overlie a semiconductor device, such as one of the semiconductor devices 112. Any number of recesses 130 over one of the semiconductor devices 112 are contemplated. In some embodiments, a portion of the semiconductor substrate 102 remains over one of the semiconductor devices 112 to separate the recess 130 therefrom. Other structures and/or configurations of the recesses 130 are within the scope of the present disclosure.

FIG. 1E illustrates removal of the patterned mask layer 126, according to some embodiments. The patterned mask layer 126 is removed after the recesses 130 are formed. The patterned mask layer 126 is removed by at least one of chemical-mechanical polishing (CMP), etching, or other suitable techniques. The etching process is at least one of a dry etching process, a wet etching process, an anisotropic etching process, an isotropic etching process, or another suitable etching process. The etching process uses at least one of HF, diluted HF, HCl$_2$, H$_2$S, or other suitable material. Other processes and/or techniques for removing the patterned mask layer 126 are within the scope of the present disclosure.

In some embodiments, a portion of the semiconductor substrate 102 defines a recess 132 of the recesses 130. The recess 132 has at least one of a first recess tapered sidewall 134 or a second recess tapered sidewall 136. The first recess tapered sidewall 134 has a first recess slope, such as a negative slope, or the second recess tapered sidewall 136 has a second recess slope, such as a positive slope. In some embodiments, the second recess slope is opposite in polarity relative to the first recess slope. In some embodiments, the recess 132 has a triangular shape. In some embodiments, a cross-sectional area of the recess 132 decreases along the direction 113, such that a width of an upper portion of the recess 132 is greater than a width of a lower portion of the recess 132. Other structures and/or configurations of the recesses 130, such as the recess 132, are within the scope of the present disclosure.

In some embodiments, the semiconductor substrate 102 having a specific crystallographic orientation, such as crystalline silicon with at least one of a <100> crystallographic orientation, a <110> crystallographic orientation, or a <111> crystallographic orientation, enables an etching process to form the recess tapered sidewalls (e.g., the first recess tapered sidewall and the second recess tapered sidewall 136). In some embodiments, portions of the semiconductor substrate 102 have different crystallographic orientations, such as at least one of a <100> crystallographic orientation, a <110> crystallographic orientation, or a <111> crystallographic orientation, where etch rates of the etching process differ between the different crystallographic orientations at least due to different densities of the different crystallographic orientations, resulting in the recessed tapered sidewalls being formed by the etching process.

In some embodiments, a first portion of the semiconductor substrate 102 having the first recess tapered sidewall 134 and the second recess tapered sidewall 136 has a first crystallographic orientation such as <111> crystallographic orientation, and a second portion of the semiconductor substrate 102 that is removed to form the recess 132 has a second crystallographic orientation such as <100> crystallographic orientation. In some embodiments, a first density of the semiconductor substrate 102, such as a surface density of the first crystallographic orientation, is greater than a second density of the semiconductor substrate, such as a surface density of the second crystallographic orientation. Such differences in density may facilitate the etching process to remove the second portion of the semiconductor substrate 102 while removing little to none of the first portion of the semiconductor substrate 102 due to an etch rate of the second portion of the semiconductor substrate 102 being higher than an etch rate of the first portion of the semiconductor substrate 102. Other processes and/or techniques for forming the recessed tapered sidewalls defining the recesses 130, such as the recess 132, are within the scope of the present disclosure.

In some embodiments, a device distance 138 between a top surface of a semiconductor device, such as the second semiconductor device 112b, and at least one of an uppermost portion of the recess 132 or the top side 108 of the semiconductor substrate 102 is less than or equal to about 40,000 Å. In some embodiments, a recess distance 140 between two adjacent recesses of the recesses 130 is between about zero Å to about 20,000 Å.

In some embodiments, a set of recesses 141 are adjacent each other, such as in an offset saw tooth configuration. In some embodiments, at least some recesses of one or more sets of recesses overlie one of the semiconductor devices 112. In some embodiments, the set of recesses 141 are at least one of vertically coincident with one of the semiconductor devices 112, vertically coincident with a portion of one of the semiconductor devices 112, or vertically offset from one of the semiconductor devices 112. For example, as illustrated in FIG. 1E, the set of recesses 141 are vertically coincident with the third semiconductor device 112c. In some embodiments, the set of recesses 141 are at least one of surrounded by a doped region of the semiconductor substrate 102, surrounded by a portion of a doped region of the semiconductor substrate 102, laterally surrounded by a doped region of the semiconductor substrate 102, or laterally surrounded by a portion of a doped region of the semiconductor substrate 102. For example, as illustrated in FIG. 1E, the set of recesses 141 are laterally surrounded by the doped region 102a of the semiconductor substrate 102 and are surrounded by a portion of the doped region 102a of the semiconductor substrate 102 that underlies the set of recesses 141. Other structures and/or configurations of the recesses 141 are within the scope of the present disclosure.

FIG. 1F illustrates a cross-sectional view of the semiconductor arrangement 100, according to some embodiments, where at least some recesses 130 are directly adjacent. In some embodiments, a second set of recesses 142 are directly adjacent each other, such as in a saw tooth configuration. In some embodiments, at least some recesses of one or more second sets of recesses overlie one of the semiconductor devices 112. In some embodiments, the second set of recesses 142 are at least one of vertically coincident with one of the semiconductor devices 112, vertically coincident with a portion of one of the semiconductor devices 112, or vertically offset from one of the semiconductor devices 112. For example, as illustrated in FIG. 1F, the second set of recesses 142 are vertically coincident with the second semiconductor device 112b. In some embodiments, the second set of recesses 142 are at least one of surrounded by a doped region of the semiconductor substrate 102, surrounded by a portion of a doped region of the semiconductor substrate 102, laterally surrounded by a doped region of the semiconductor substrate 102, or laterally surrounded by a portion of a doped region of the semiconductor substrate 102. For example, as illustrated in FIG. 1F, the second set of recesses 142 are laterally surrounded by the doped region 102a of the semiconductor substrate 102 and are surrounded by a portion of the doped region 102a of the semiconductor substrate 102 that underlies the second set of recesses 142.

FIG. 1G illustrates a first dielectric layer 144 formed over the semiconductor substrate 102, according to some embodiments. In some embodiments, the first dielectric layer 144 is in direct contact with the top side 108 of the semiconductor substrate 102 and/or the recess tapered sidewalls defined in the semiconductor substrate 102, such as the first recess tapered sidewall 134 and the second recess tapered sidewall 136 defining the recess 132. In some embodiments, the first dielectric layer 144 is in indirect contact with the top side 108 of the semiconductor substrate 102 and/or the recess tapered sidewalls defined in the semiconductor substrate 102. Other structures and/or configurations of the first dielectric layer 144 are within the scope of the present disclosure.

In some embodiments, the semiconductor arrangement 100 comprises a buffer layer (not shown) between the semiconductor substrate 102 and the first dielectric layer 144, such as formed the semiconductor substrate 102 prior to forming the first dielectric layer 144. The buffer layer is in direct contact with the top side 108 of the semiconductor substrate 102 and/or the recess tapered sidewalls defined in the semiconductor substrate 102, or is in indirect contact with the top side 108 of the semiconductor substrate 102 and/or the recess tapered sidewalls defined in the semiconductor substrate 102.

The buffer layer comprises at least one of an anti-reflection coating, $SiO_2$, HfSiON, $HfSiO_x$, $HfAlO_x$, $HfO_2$, $ZrO_2$, $La_2O_3$, $Y_2O_3$, or other suitable material. The buffer layer is formed by at least one of PVD, sputtering, CVD, LPCVD, ALCVD, UHVCVD, RPCVD, ALD, MBE, LPE, spin on, growth, or other suitable techniques. In some embodiments, the buffer layer comprises a single layer that is configured to provide adhesion between the first dielectric layer 144 and the semiconductor substrate 102. According to some embodiments, the buffer layer comprises multiple layers, where an outer layer of the multiple layers is configured to provide adhesion with the first dielectric layer 144. When the semiconductor arrangement 100 comprises the buffer layer, the first dielectric layer 144 at least one of overlies the buffer layer, is in direct contact with a top surface of the buffer layer, or is in indirect contact with the top surface of the buffer layer. Other structures and/or configurations of the buffer layer are within the scope of the present disclosure.

The first dielectric layer 144 comprises at least one of SiO, $SiO_2$, SiN, $Si_3N_4$, MgO, $Al_2O_3$, $Yb_2O_3$, ZnO, $Ta_2O_5$, $ZrO_2$, $HfO_2$, $TeO_2$, $TiO_2$, an oxide layer, or other suitable material. The first dielectric layer 144 is formed by at least one of PVD, sputtering, CVD, LPCVD, ALCVD, UHVCVD, RPCVD, ALD, MBE, LPE, spin on, growth, or other suitable techniques. The first dielectric layer 144 is formed over at least one of in the recesses 130, a set of the recesses 130, or all of the recesses 130. In some embodiments, the first dielectric layer 144 is formed over the top side 108 of the semiconductor substrate 102. In some embodiments, a first dielectric layer distance 146 between a top surface of the first dielectric layer 144 and the top side 108 of the semiconductor substrate 102 is less than or equal to about 10,000 Å.

In some embodiments, dielectric layer portions of the first dielectric layer 144 are in at least one of the recesses 130. For example, as illustrated in FIG. 1G, a first dielectric layer portion 148 of the first dielectric layer 144 is in the recess 132. The first dielectric layer portion 148 of the first dielectric layer 144 has a first dielectric tapered sidewall 150 with which the first recess tapered sidewall 134 of the semiconductor substrate 102 aligns. When the semiconductor arrangement 100 comprises the buffer layer over the semiconductor substrate 102, a portion of the buffer layer separates the first dielectric tapered sidewall 150 of the first dielectric layer portion 148 of the first dielectric layer 144 from the first recess tapered sidewall 134 of the semiconductor substrate 102.

The first dielectric layer portion 148 of the first dielectric layer 144 has a second dielectric tapered sidewall 152 with which the second recess tapered sidewall 136 of the semiconductor substrate 102 aligns. When the semiconductor arrangement 100 comprises the buffer layer over the semiconductor substrate 102, a portion of the buffer layer separates the second dielectric tapered sidewall 152 of the first dielectric layer portion 148 of the first dielectric layer 144 from the second recess tapered sidewall 136 of the semiconductor substrate 102. In some embodiments, one or more of the dielectric layer portions of the first dielectric layer 144 overlies one of the semiconductor devices 112. For example, as illustrated in FIG. 1G, the first dielectric layer portion 148 overlies the first semiconductor device 112a. In some embodiments, one or more of the dielectric layer portions of the first dielectric layer 144 are at least one of vertically coincident with one of the semiconductor devices 112, vertically coincident with a portion of one of the semiconductor devices 112, or vertically offset from one of the semiconductor devices 112. For example, as illustrated in FIG. 1G, the first dielectric layer portion 148 is vertically coincident with the first semiconductor device 112a. In some embodiments, at least one of a portion of the buffer layer or a portion of the semiconductor substrate 102 separate the first dielectric layer portion 148 of the first dielectric layer 144 from the first semiconductor device 112a.

In some embodiments, the first dielectric layer portion 148 of the first dielectric layer 144 in the recess 132 is a high absorption (HA) structure, such as due, at least in part, to at least one of the first dielectric tapered sidewall 150, the second dielectric tapered sidewall 152, the first recess tapered sidewall 134, or the second recess tapered sidewall 136. An HA structure, such as the first dielectric layer portion 148, directs more radiation to a semiconductor device underlying the first dielectric layer portion 148 of the first dielectric layer 144 as compared to a portion of the first dielectric layer 144 and a portion of the semiconductor substrate 102 that do not have one or more tapered sidewalls. One or more additional portions of the first dielectric layer 144 in recesses 130 in the semiconductor substrate 102 are similarly constructed HA structures that overlie one of the semiconductor devices 112.

In some embodiments, two or more HA structures are laterally adjacent each other. For example, as illustrated in FIG. 1G, a first HA structure 154 is laterally adjacent to a second HA structure 156. An HA distance 158 between two adjacent HA structures, such as the first HA structure 154 and the second HA structure 156 is between about zero Å to about 20,000 Å. In some embodiments, two or more HA structures 710 are directly adjacent each other. For example, as illustrated in FIG. 1G, a set of HA structures 160 are directly adjacent each other, such as in a saw tooth configuration. In some embodiments, at least some HA structures of one or more sets of HA structures are at least one of vertically coincident with one of the semiconductor devices 112, vertically coincident with a portion of one of the semiconductor devices 112, or vertically offset from one of the semiconductor devices 112. For example, as illustrated in FIG. 1G, the set of HA structures 160 are vertically coincident with the third semiconductor device 112c. In some embodiments, at least some HA structures of one or more sets of HA structures are at least one of surrounded by a doped region of the semiconductor substrate 102, surrounded by a portion of a doped region of the semiconductor substrate 102, laterally surrounded by a doped region of the semiconductor substrate 102, or laterally surrounded by a portion of a doped region of the semiconductor substrate 102. For example, as illustrated in FIG. 1G, the set of HA structures 160 are laterally surrounded by the doped region 102a of the semiconductor substrate 102 and are surrounded by a portion of the doped region 102a of the semiconductor substrate 102 that underlies the set of HA structures 160. Other structures and/or configurations of HA structures are within the scope of the present disclosure.

FIG. 1H illustrates a photoresist 162 formed over the first dielectric layer 144, according to some embodiments. The photoresist 162 at least one of overlies the first dielectric layer 144, is in direct contact with the first dielectric layer 144, or is in indirect contact with the first dielectric layer 144. The photoresist 162 is formed by at least one of PVD, sputtering, CVD, LPCVD, ALCVD, UHVCVD, RPCVD, ALD, MBE, LPE, spin on, growth, or other suitable techniques. The photoresist 162 comprises a light-sensitive material, where properties, such as solubility, of the photoresist 162 are affected by light. The photoresist 162 is a negative photoresist or a positive photoresist.

FIG. 1I illustrates the photoresist 162 patterned to form a patterned photoresist 164 over the first dielectric layer 144, according to some embodiments. The patterned photoresist 164 has openings exposing portions of the first dielectric layer 144. In some embodiments, the openings in the patterned photoresist 164 are between the semiconductor devices 112, such that the openings do not overlie or are laterally offset from the semiconductor devices 112. In some embodiments, an opening in the patterned photoresist 164 is between two adjacent semiconductor devices, such that the opening overlies a portion of the semiconductor substrate 102 between, for example, the first semiconductor device 112a and the second semiconductor device 112b. According to some embodiments, an opening in the patterned photoresist 164 overlies a portion of one or more of the semiconductor devices 112.

FIG. 1J illustrates shallow trenches 166 formed using the patterned photoresist 164, according to some embodiments. The shallow trenches 166 extend through the first dielectric layer 144 and into the semiconductor substrate 102. In some embodiments, the shallow trenches 166 extend into the doped region 102a of the semiconductor substrate 102. In some embodiments, the shallow trenches 166 extend into the second region 102b of the semiconductor substrate 102. The shallow trenches 166 are at least one of laterally offset from a semiconductor device or between two of the semiconductor devices 112. In some embodiments, one of the shallow trenches 166, such as a shallow trench 168, is between two adjacent semiconductor devices, such as the first semiconductor device 112a and the second semiconductor device 112b. In some embodiments, one of the shallow trenches 166, such as the second shallow trench 170, is adjacent to the shallow trench 168. For example, as illustrated in FIG. 1J, the second shallow trench 170 is adjacent to the shallow trench 168 with the second semiconductor device 112b disposed therebetween. In some embodiments, one or more portions of the semiconductor substrate 102 separates one of the shallow trenches 166 from one or more of the semiconductor devices 112. For example, as illustrated in FIG. 1J, a first semiconductor substrate portion 172 of the semiconductor substrate 102 separates the shallow trench 168 from the first semiconductor device 112a of two adjacent semiconductor devices (the first semiconductor device 112a and the second semiconductor device 112b). A second semiconductor substrate portion 174 of the semiconductor substrate 102 separates the shallow trench 168 from the second semiconductor device 112b of two adjacent semiconductor devices (the first semiconductor device 112a and the second semiconductor device 112b). In some embodiments, an etching process is performed to form the shallow trenches 166, where openings in the patterned photoresist 164 allow one or more etchants applied during the etching process to remove portions of the first dielectric layer 144 and/or portions of the semiconductor substrate 102 while the patterned photoresist 164 protects or shields portions of the first dielectric layer 144 and/or portions of the semiconductor substrate 102 that are covered by the patterned photoresist 164. The etching process is at least one of a dry etching process, a wet etching process, an anisotropic etching process, an isotropic etching process, or another suitable etching process. The etching process uses at least one of HF, diluted HF, HCl$_2$, H$_2$S, or other suitable material.

In some embodiments, the shallow trench 168 has at least one of a first trench tapered sidewall 176 or a second trench tapered sidewall 178. The first trench tapered sidewall 176 has a first trench slope, such as a negative slope, or the second trench tapered sidewall 178 has a second trench slope, such as a positive slope. In some embodiments, the second trench slope is opposite in polarity relative to the first trench slope. In some embodiments, the shallow trench 168 has a trapezoidal shape such that a third trench sidewall 180 connects the first trench tapered sidewall 176 to the second trench tapered sidewall 178. In some embodiments, the third trench tapered sidewall is perpendicular to the direction 113. In some embodiments, a cross-sectional area of the shallow trench 168 decreases along the direction 113, such that a width of an upper portion of the shallow trench 168 is greater than a width of a lower portion of the shallow trench 168.

According to some embodiments, the first semiconductor device 112a or portions of the first semiconductor device 112a are adjacent to or directly adjacent to the first trench tapered sidewall 176. In some embodiments, the second semiconductor device 112b or portions of the second semiconductor device 112b are adjacent to or directly adjacent to the second trench tapered sidewall 178. The doped region 102a of the semiconductor substrate 102 has a top doped side 182 and a bottom doped side 184. In some embodiments, the top doped side 182 of the doped region 102a of the semiconductor substrate 102 is contiguous with the top side 108 of the semiconductor substrate 102. In some embodiments, the top doped side 182 of the doped region 102a of the semiconductor substrate 102 is vertically offset from the top side 108 of the semiconductor substrate 102. In some embodiments, a bottom side 186 of the first semiconductor device 112a or a portion of the bottom side 186 of the first semiconductor device 112a is adjacent or directly adjacent to the bottom doped side 184 of the doped region 102a of the semiconductor substrate 102.

In some embodiments, the third trench sidewall 180 extends a third trench sidewall distance 188 into the semiconductor substrate 102 from the top side 108 of the semiconductor substrate 102. In some embodiments, the bottom side 186 of the first semiconductor device 112a extends a bottom side distance 190 into the semiconductor substrate 102 from the top side 108 of the semiconductor substrate 102. In some embodiments, the third trench sidewall distance 188 is greater than the bottom side distance 190. In some embodiments, the doped region 102a of the semiconductor substrate 102 extends a doped region distance 192 into the semiconductor substrate 102 from the top side 108 of the semiconductor substrate 102. In some embodiments, the third trench sidewall distance 188 is greater than the doped region distance 192. Other processes and/or techniques for forming the shallow trenches 166 are within the scope of the present disclosure.

FIG. 1K illustrates removal of the patterned photoresist 164, according to some embodiments. The patterned photoresist 164 is removed after the shallow trenches 166 are formed. The patterned photoresist 164 is removed by at least one of CMP, etching, or other suitable techniques. In some embodiments, removal of the patterned photoresist 164 exposes the top surface of the first dielectric layer 144.

A portion of the first dielectric layer 144 defining the shallow trench 168 has a first dielectric sidewall 194 and a second dielectric sidewall 196. In some embodiments, at least some of the first dielectric sidewall 194 is tapered and/or at least some of the second dielectric sidewall 196 is tapered. The first dielectric sidewall 194 has a first slope, such as a negative slope, and/or the second dielectric sidewall 196 has a second slope, such as a positive slope. In some embodiments, the second slope is opposite in polarity relative to the first slope. In some embodiments, a cross-sectional area of the first dielectric layer 144 defining the shallow trench 168 decreases along the direction 113, such that a width of an upper portion of the shallow trench 168 is greater than a width of a lower portion of the shallow trench 168.

According to some embodiments, at least some of a sidewall defining the shallow trench 168, such as at least some of the first trench tapered sidewall 176, at least some of the second trench tapered sidewall 178, at least some of the first dielectric sidewall 194, and/or at least some of the second dielectric sidewall 196, extends vertically, such as in a direction parallel to the direction 113.

In some embodiments, a lowermost portion of the shallow trench 168 (e.g., the third trench sidewall 180 of the shallow trench 168) is lower than an uppermost portion of one of the semiconductor devices 112 (e.g., a top side 198 of the first semiconductor device 112a). According to some embodiments, the lowermost portion of the shallow trench 168 is lower than a lowermost portion of one of the semiconductor devices 112 (e.g., the bottom side 186 of the first semiconductor device 112a). According to some embodiments, the lowermost portion of the shallow trench 168 is lower than lowermost portions of adjacent semiconductor devices (e.g., the bottom side 186 of the first semiconductor device 112a and a bottom side 200 of the second semiconductor device 112b). Other structures and/or configurations of the shallow trenches 166 are within the scope of the present disclosure.

FIG. 1L illustrates a buffer layer 202 formed over the first dielectric layer 144 and in the shallow trenches 166, according to some embodiments. In some embodiments, the buffer layer 202 is in direct contact with the top surface of the first dielectric layer 144, the first trench tapered sidewall 176, the second trench tapered sidewall 178, and/or the third trench sidewall 180 defined in the semiconductor substrate 102. In some embodiments, the buffer layer 202 is in direct contact with the first dielectric sidewall 194 and/or the second dielectric sidewall 196 defined in the first dielectric layer 144. In some embodiments, the buffer layer 202 is in indirect contact with the top surface of the first dielectric layer 144, the first trench tapered sidewall 176, the second trench tapered sidewall 178, and/or the third trench sidewall 180 defined in the semiconductor substrate 102. In some embodiments, the buffer layer 202 is in indirect contact with the first dielectric sidewall 194 and/or the second dielectric sidewall 196 defined in the first dielectric layer 144.

In some embodiments, the buffer layer 202 comprises at least one of SiO, $SiO_2$, HfSiON, $HfSiO_x$, $HfAlO_x$, $HfO_2$, $ZrO_2$, $La_2O_3$, $Y_2O_3$, silicon nitride ($Si_3N_4$), silicon oxynitride ($SiO_xN_y$), aluminum oxide, hafnium oxide, tantalum nitride, spin-on glass (SOG), fluorinated silica glass (FSG), carbon doped silicon oxide (e.g., SiCOH), a high-density-plasma (HDP) oxide, an HDP-CVD oxide, or other suitable material. The buffer layer 202 is formed by at least one of PVD, sputtering, CVD, HDP-CVD, LPCVD, ALCVD, UHVCVD, RPCVD, ALD, MBE, LPE, spin on, growth, or other suitable techniques. For example, in HDP-CVD, a gas mixture comprising silicon, oxygen, and one or more inert gases may be used. The one or more inert gases of this mixture may comprise about less than 20% of the total gas mixture. In some embodiments, the gas mixture may comprise silane, oxygen, and an inert gas, such as argon. The inert gas pressure and chamber pressure are kept low while the sputter rf energy is increased.

A first portion of the buffer layer 202 is in the shallow trench 168. In some embodiments, the first portion of the buffer layer 202 has a first buffer sidewall 204 with which at least one of the first trench tapered sidewall 176 of the semiconductor substrate 102 or the first dielectric sidewall 194 of the first dielectric layer 144 aligns. The first portion of the buffer layer 202 in the shallow trench 168 has a second buffer sidewall 206 with which at least one of the second trench tapered sidewall 178 of the semiconductor substrate 102 or the second dielectric sidewall 196 of the first dielectric layer 144 aligns. In some embodiments, the first portion of the buffer layer 202 in the shallow trench 168 has a third buffer sidewall 208 with which the third trench sidewall 180 of the semiconductor substrate 102 aligns.

In some embodiments, a portion of the buffer layer 202 comprises a buffer structure, such as one or more portions of a buffer sidewall (e.g., the first buffer sidewall 204, the second buffer sidewall 206, the third buffer sidewall 208, etc.), which has a buffer sidewall thickness 210. In some embodiments, the buffer sidewall thickness 210 is between about ($\approx$) 100 Å to about 500 Å to buffer against contamination, such as dopants of the doped region 102a. Such contamination may also be present from manufacturing operations, such as a cleaning process, which may present chemicals that could damage, react with, and/or penetrate inside components or devices in the semiconductor substrate 102. The sidewall thickness 210 is not merely a matter of design choice, but is critical to, at least, provide sufficient buffering of contamination while not consuming too much space of a shallow trench within which the buffer layer 202 is formed. If the sidewall thickness 210 is too thin, for example, then contaminants might past trough the buffer layer 202 and/or the buffer layer 202 might not provide sufficient stress release. If the buffer layer 202 is too thick, for example, then there might not be sufficient room in the shallow trench within which the buffer layer 202 is formed to accommodate additional layers, materials, etc. necessary for desired device operation, functioning, etc. If the buffer layer 202 is too thick, for example, then subsequent layers formed on the first buffer sidewall 204, the second buffer sidewall 206, etc., such as an adhesion layer and a reflection layer (set forth in greater detail below) might be too close to provide proper adhesion and/or reflection. If the buffer layer 202 is too thick, for example, then efficacy of etching, cleaning, etc. of the shallow trench during subsequent operations may be reduced causing improper formation of subsequent layers, contamination, etc. Other structures and/or configurations of the buffer layer 202 are within the scope of the present disclosure.

FIG. 1M illustrates removal of portions of the buffer layer 202 and portions of the first dielectric layer 144, according to some embodiments. In some embodiments, portions of the buffer layer 202 along top surfaces of first dielectric layer 144 and along sidewalls of the first dielectric layer 144 (e.g., the first dielectric sidewall 194 and the second dielectric sidewall 196) are removed to retain buffer structures, such as a buffer structure 212. In some embodiments, the buffer structure 212 is contiguous with the doped region 102a of the semiconductor substrate 102. The buffer structure 212 has the buffer sidewall thickness 210, set forth in greater detail herein. In some embodiments, portions of the first dielectric layer 144 above the top side 108 of the semiconductor substrate 102 are removed to retain dielectric layer portions within the recesses 130, such as the first dielectric layer portion 148 within the recess 132. The portions of the buffer layer 202 and the portions of the first dielectric layer 144 are removed by at least one of chemical-mechanical polishing (CMP), etching, or other suitable techniques. The etching process is at least one of a dry etching process, a wet etching process, an anisotropic etching process, an isotropic etching process, or another suitable etching process. The etching process uses at least one of HF, diluted HF, $HCl_2$, $H_2S$, or other suitable material.

In some embodiments, the buffer structures, such as the buffer structure 212, are at least one of horizontally coincident with one or more of the semiconductor devices 112, horizontally coincident with a portion of one or more of the semiconductor devices 112, horizontally offset from one or more of the semiconductor devices 112, or horizontally offset from a portion of one or more of the semiconductor devices 112. For example, as illustrated in FIG. 1M, the buffer structure 212 is horizontally offset from a portion of the first semiconductor device 112a and horizontally offset from a portion of the second semiconductor device 112b. As set forth herein and in some embodiments, one or more of the semiconductor devices 112 or portions of the semiconductor devices 112 may be coincident with the tapered sidewalls of the shallow trenches 166 such that portions of the semiconductor devices 112 are horizontally offset from the buffer structure 212 that aligns with the tapered sidewalls.

In some embodiments, the buffer structure 212 comprises at least one of the first buffer sidewall 204 or the second buffer sidewall 206. The first buffer sidewall 204 has a first buffer slope, such as a negative slope, or the second buffer sidewall 206 has a second buffer slope, such as a positive slope. In some embodiments, the second buffer slope is opposite in polarity relative to the first buffer slope. In some embodiments, the buffer structure 212 has a trapezoidal shape such that the third buffer sidewall 208 connects the first buffer sidewall 204 to the second buffer sidewall 206. In some embodiments, the third buffer sidewall 208 is perpendicular to the direction 113. In some embodiments, a cross-sectional area of the buffer structure 212 decreases along the direction 113, such that a width of an upper portion of the buffer structure 212 is greater than a width of a lower portion of the buffer structure 212. Other processes and/or techniques for removing the portions of the buffer layer 202 and the portions of the first dielectric layer 144 are within the scope of the present disclosure.

FIG. 1N illustrates an adhesion layer 214 formed over the semiconductor substrate 102 and in the shallow trenches 166, according to some embodiments. In some embodiments, the adhesion layer 214 is in direct contact with the top side 108 of the semiconductor substrate 102, the first buffer sidewall 204, the second buffer sidewall 206, and/or the third buffer sidewall 208 of the buffer structure 212. In some embodiments, the adhesion layer 214 is in indirect contact with the top side 108 of the semiconductor substrate 102, the first buffer sidewall 204, the second buffer sidewall 206, and/or the third buffer sidewall 208 of the buffer structure 212. In some embodiments, the adhesion layer 214 is formed as a single layer in a single manufacturing operation. In some embodiments, the adhesion layer 214 is formed as multiple layers of the same material in multiple manufacturing operations.

In some embodiments, the adhesion layer 214 comprises titanium (Ti), a mixture of Ti and one or more metals, or other suitable material. The adhesion layer 214 is formed by at least one of PVD, sputtering, CVD, HDP-CVD, LPCVD, ALCVD, UHVCVD, RPCVD, ALD, MBE, LPE, spin on, growth, or other suitable techniques. A first portion of the adhesion layer 214 is in the shallow trench 168. In some embodiments, the first portion of the adhesion layer 214 has a first adhesion sidewall 216 with which the first buffer sidewall 204 of the buffer structure 212 aligns. The first portion of the adhesion layer 214 in the shallow trench 168 has a second adhesion sidewall 218 with which the second buffer sidewall 206 of the buffer structure 212 aligns. In some embodiments, the first portion of the adhesion layer 214 in the shallow trench 168 has a third adhesion sidewall 220 with which the third buffer sidewall 208 of the buffer structure 212 aligns.

In some embodiments, a portion of the adhesion layer 214 comprises one or more adhesion structures. An adhesion structure, such as one or more portions of an adhesion sidewall (e.g., the first adhesion sidewall 216, the second adhesion sidewall 218, the third adhesion sidewall 220, etc.), is, for example, adhesively bonded to the buffer structure 212 has an adhesion sidewall thickness 222. In some embodiments, the adhesion sidewall thickness 222 is greater than about (≥) 100 Å to provide adhesion to the buffer structure 212. The adhesion sidewall thickness 222 is not merely a matter of design choice, but is critical to, at least, provide sufficient adhesion to the buffer structure 212. If the adhesion sidewall thickness 222 is too thick and/or too thin, for example, then the adhesion layer 214 might not sufficiently bond to the buffer structure 212. If the adhesion layer 214 is too thick, for example, then subsequent layers formed on the first adhesion sidewall 216, the second adhesion sidewall 218, etc., such as a reflection layer (set forth in greater detail below) might be too close to provide proper reflection. If the adhesion layer 214 is too thick, for example, then efficacy of etching, cleaning, etc. of the shallow trench during subsequent operations may be reduced causing improper formation of subsequent layers, contamination, etc. If the adhesion layer 214 is too thin, for example, then subsequent layers formed on the first adhesion sidewall 216, the second adhesion sidewall 218, etc., such as a reflection layer (set forth in greater detail below) might not sufficiently bond within the shallow trench. Other structures and/or configurations of the adhesion layer 214 are within the scope of the present disclosure.

FIG. 1O illustrates a reflection layer 224 formed over the semiconductor substrate 102, over the adhesion layer 214, and in the shallow trenches 166, according to some embodiments. In some embodiments, the reflection layer 224 is in direct contact with a top side of the adhesion layer 214, the first adhesion sidewall 216, the second adhesion sidewall 218, and/or the third adhesion sidewall 220 of the adhesion layer 214. In some embodiments, the reflection layer 224 is in indirect contact with at least one of the top side of the adhesion layer 214, the top side 108 of the semiconductor substrate 102, the first adhesion sidewall 216, the first buffer sidewall 204, the first trench tapered sidewall 176, the second adhesion sidewall 218, the second buffer sidewall 206, the second trench tapered sidewall 178, the third adhesion sidewall 220, the third buffer sidewall 208, or the third trench sidewall 180. In some embodiments, the reflection layer 224 is formed as a single layer in a single manufacturing operation. In some embodiments, the reflection layer 224 is formed as multiple layers of the same material in multiple manufacturing operations.

In some embodiments, the reflection layer 224 comprises titanium nitride (TiN), a mixture of TiN and one or more metals, or other suitable material. The reflection layer 224 is formed by at least one of PVD, sputtering, CVD, HDP-CVD, LPCVD, ALCVD, UHVCVD, RPCVD, ALD, MBE, LPE, spin on, growth, or other suitable techniques. A first portion of the reflection layer 224 is in the shallow trench 168. In some embodiments, the first portion of the reflection layer 224 has a first reflection sidewall 226 with which the first adhesion sidewall 216 of the adhesion layer 214 aligns. The first portion of the reflection layer 224 in the shallow trench 168 has a second reflection sidewall 228 with which the second adhesion sidewall 218 of the adhesion layer 214 aligns. In some embodiments, the first portion of the reflection layer 224 in the shallow trench 168 has a third reflection sidewall 230 with which the third adhesion sidewall 220 of the adhesion layer 214 aligns.

In some embodiments, a portion of the reflection layer 224 comprises one or more reflection structures. A reflection structure, such as one or more portions of a reflection sidewall (e.g., the first reflection sidewall 226, the second reflection sidewall 228, the third reflection sidewall 230, etc.), for example, is adhesively bonded to one or more portions of the adhesion layer 214 (e.g., one or more portions of an adhesion structure) and has a reflection sidewall thickness 232. In some embodiments, the reflection sidewall thickness 232 is greater than or equal to three times the adhesion sidewall thickness 222. In some embodiments, the reflection sidewall thickness 232 is greater than or equal to about (≥) 300 Å to provide reflection of electromagnetic radiation away from the shallow trenches 166 and towards the semiconductor devices 112 (e.g., a photodiode). The reflection sidewall thickness 232 (e.g., relative to the adhesion sidewall thickness 222) is not merely a matter of design choice, but is critical to, at least, provide sufficient reflection of electromagnetic radiation. If the reflection sidewall thickness 232 (e.g., relative to the adhesion sidewall thickness 222) is too thin, for example, then electromagnetic radiation might not be sufficiently reflected by the reflection structure, such that an insufficient amount of electromagnetic radiation might be reflected away from a shallow trench and towards a semiconductor device (e.g., and thus the semiconductor device might not register or provide an indication of electromagnetic radiation). If the reflection sidewall thickness 232 (e.g., relative to the adhesion sidewall thickness 222) is too thick, for example, then electromagnetic radiation might not be sufficiently reflected by the reflection structure, such that an insufficient amount of electromagnetic radiation might be reflected away from the shallow trench. If the reflection layer 224 is too thick, for example, then efficacy of etching, cleaning, etc. of the shallow trench during subsequent operations may be reduced causing improper formation of subsequent layers, contamination, etc. Other structures and/or configurations of the reflection layer 224 are within the scope of the present disclosure.

FIG. 1P illustrates removal of portions of the adhesion layer 214 and portions of the reflection layer 224, according to some embodiments. In some embodiments, portions of the reflection layer 224 along top surfaces of adhesion layer 214 and along portions of the sidewalls of the adhesion layer 214 (e.g., a portion of the first reflection sidewall 226 and the second reflection sidewall 228) are removed to retain electromagnetic reflection structures, such as an electromagnetic reflection structure 234. In some embodiments, portions of the adhesion layer 214 along the top side 108 of the semiconductor substrate 102 and along portions of the sidewalls of the buffer structure 212 (e.g., a portion of the first adhesion sidewall 216 and the second adhesion sidewall 218) are removed to retain adhesion structures, such as an adhesion structure 236. In some embodiments, the adhesion structure 236 comprises titanium and is formed as an adhesion layer contiguous with the buffer structure 212. In some embodiments, the electromagnetic reflection structure 234 comprises titanium nitride and is formed as a reflection layer contiguous with the adhesion structure 236. In some embodiments, the electromagnetic reflection structure 234 has the reflection sidewall thickness 232 and the adhesion structure 236 has the adhesion sidewall thickness 222, set forth in greater detail herein. In some embodiments, the reflection sidewall thickness 232 is greater than the adhesion sidewall thickness 222. In some embodiments, the reflection sidewall thickness 232 is greater than or equal to three times the adhesion sidewall thickness 222. In some embodiments, a top surface of the electromagnetic reflection structure 234 and a top surface of the adhesion structure 236 are separated by the top side 108 of the semiconductor substrate 102 by a top side distance 238. The top surface of the electromagnetic reflection structure 234 and the top surface of the adhesion structure 236 extend into the semiconductor substrate 102 by the top side distance 238 from the top side 108 of the semiconductor substrate 102.

In some embodiments, portions of the adhesion layer 214 and portions of the reflection layer 224 above the top side 108 of the semiconductor substrate 102 are removed to retain dielectric layer portions within the recesses 130, such as the first dielectric layer portion 148 within the recess 132. In some embodiments, the portions of the adhesion layer 214 and the portions of the reflection layer 224 above the top side 108 of the semiconductor substrate 102 are removed in a same processing operation. The portions of the adhesion layer 214 and the portions of the reflection layer 224 are removed by at least one of chemical-mechanical polishing (CMP), etching, or other suitable techniques. The etching process is at least one of a dry etching process, a wet etching process, an anisotropic etching process, an isotropic etching process, or another suitable etching process. The etching process uses at least one of HF, diluted HF, HCl$_2$, H$_2$S, or other suitable material.

In some embodiments, the reflection structures are at least one of horizontally coincident with one or more of the semiconductor devices 112, horizontally coincident with a portion of one or more of the semiconductor devices 112, horizontally offset from one or more of the semiconductor devices 112, or horizontally offset from a portion of one or more of the semiconductor devices 112. For example, as illustrated in FIG. 1P, the electromagnetic reflection structure 234 comprising the first reflection sidewall 226, the second reflection sidewall 228, and the third reflection sidewall 230 is horizontally offset from a portion of the first semiconductor device 112a and horizontally offset from a portion of the second semiconductor device 112b.

In some embodiments, the electromagnetic reflection structure 234 comprises at least one of the first reflection sidewall 226 or the second reflection sidewall 228. The first reflection sidewall 226 has a first reflection slope, such as a negative slope, or the second reflection sidewall 228 has a second reflection slope, such as a positive slope. In some embodiments, the second reflection slope is opposite in polarity relative to the first reflection slope. In some embodiments, the electromagnetic reflection structure 234 has a trapezoidal shape such that the third reflection sidewall 230 connects the first reflection sidewall 226 to the second reflection sidewall 228. In some embodiments, the third reflection sidewall 230 is perpendicular to the direction 113. In some embodiments, a cross-sectional area of the electromagnetic reflection structure 234 decreases along the direction 113, such that a width of an upper portion of the electromagnetic reflection structure 234 is greater than a width of a lower portion of the electromagnetic reflection structure 234.

In some embodiments, the adhesion structures are at least one of horizontally coincident with one or more of the semiconductor devices 112, horizontally coincident with a portion of one or more of the semiconductor devices 112, horizontally offset from one or more of the semiconductor devices 112, or horizontally offset from a portion of one or more of the semiconductor devices 112. For example, as illustrated in FIG. 1P, the adhesion structure 236 comprising the first adhesion sidewall 216, the second adhesion sidewall 218, and the third adhesion sidewall 220 is horizontally offset from a portion of the first semiconductor device 112a and horizontally offset from a portion of the second semiconductor device 112b.

In some embodiments, the adhesion structure 236 comprises at least one of the first adhesion sidewall 216 or the second adhesion sidewall 218. The first adhesion sidewall 216 has a first adhesion slope, such as a negative slope, or the second adhesion sidewall 218 has a second adhesion slope, such as a positive slope. In some embodiments, the second adhesion slope is opposite in polarity relative to the first adhesion slope. In some embodiments, the adhesion structure 236 has a trapezoidal shape such that the third adhesion sidewall 220 connects the first adhesion sidewall 216 to the second adhesion sidewall 218. In some embodiments, the third adhesion sidewall 220 is perpendicular to the direction 113. In some embodiments, a cross-sectional area of the adhesion structure 236 decreases along the direction 113, such that a width of an upper portion of the adhesion structure 236 is greater than a width of a lower portion of the adhesion structure 236. Other configurations for removal of the portions of the adhesion layer 214 and the portions of the reflection layer 224 are within the scope of the present disclosure.

FIG. 1Q illustrates a second buffer layer 240 formed over the semiconductor substrate 102, over a top surface of the buffer structure 212, over a top surface of the adhesion structure 236, over a top surface of the electromagnetic reflection structure 234, and in the shallow trenches 166, according to some embodiments. In some embodiments, the second buffer layer 240 is in direct contact with at least one of the top side 108 of the semiconductor substrate 102, one or more of the first dielectric layer portions (e.g., the first dielectric layer portion 148), the top surface of the buffer structure 212, the top surface of the adhesion structure 236, or the top surface of the electromagnetic reflection structure 234. In some embodiments, the second buffer layer 240 is in indirect contact with at least one of the top side 108 of the semiconductor substrate 102, one or more of the first dielectric layer portions (e.g., the first dielectric layer portion 148), the top surface of the buffer structure 212, the top surface of the adhesion structure 236, or the top surface of the electromagnetic reflection structure 234. In some embodiments, the second buffer layer 240 is formed as a single layer in a single manufacturing operation. In some embodiments, the second buffer layer 240 is formed as multiple layers of the same material in multiple manufacturing operations.

In some embodiments, the second buffer layer 240 comprises at least one of SiO, $SiO_2$, HfSiON, $HfSiO_x$, $HfAlO_x$, $HfO_2$, $ZrO_2$, $La_2O_3$, $Y_2O_3$, silicon nitride ($Si_3N_4$), silicon oxynitride ($SiO_xN_y$), hafnium oxide, spin-on glass (SOG), fluorinated silica glass (FSG), carbon doped silicon oxide (e.g., SiCOH), a high-density-plasma (HDP) oxide, an HDP-CVD oxide, or other suitable material. In some embodiments, the second buffer layer 240 comprises the same material as the buffer layer 202. In some embodiments, the buffer layer 202 is a first oxide layer and the second buffer layer 240 is a second oxide layer, where the first buffer layer 202 has a greater refractive index than the second buffer layer 240. In some embodiments, the second buffer layer 240 is a second oxide layer that has a second oxide top layer thickness greater than or equal to 100 Å over the top surface of the adhesion structure 236 and the top surface of the electromagnetic reflection structure 234. The second buffer layer 240 is formed by at least one of PVD, sputtering, CVD, HDP-CVD, LPCVD, ALCVD, UHVCVD, RPCVD, ALD, MBE, LPE, spin on, growth, or other suitable techniques. In some embodiments, portions of the second buffer layer 240 at least one of fill each of the shallow trenches 166 or partially fill each of the shallow trenches 166, such as the shallow trench 168. Other structures and/or configurations of the second buffer layer 240 are within the scope of the present disclosure.

FIG. 1R illustrates removal of portions of the second buffer layer 240, according to some embodiments. In some embodiments, portions of the second buffer layer 240 above the top side 108 of the semiconductor substrate 102 are removed to retain fill structures, such as a fill structure 242. In some embodiments, portions of the second buffer layer 240 above the top side 108 of the semiconductor substrate 102 are removed to retain dielectric layer portions within the recesses 130, such as the first dielectric layer portion 148 within the recess 132. The portions of the second buffer layer 240 are removed by at least one of chemical-mechanical polishing (CMP), etching, or other suitable techniques. The etching process is at least one of a dry etching process, a wet etching process, an anisotropic etching process, an isotropic etching process, or another suitable etching process. The etching process uses at least one of HF, diluted HF, $HCl_2$, $H_2S$, or other suitable material.

In some embodiments, the fill structures, such as the fill structure 242, are at least one of horizontally coincident with one or more of the semiconductor devices 112, horizontally coincident with a portion of one or more of the semiconductor devices 112, horizontally offset from one or more of the semiconductor devices 112, or horizontally offset from a portion of one or more of the semiconductor devices 112. For example, as illustrated in FIG. 1R, the fill structure 242 is horizontally offset from a portion of the first semiconductor device 112a and horizontally offset from a portion of the second semiconductor device 112b. As set forth herein and in some embodiments, one or more of the semiconductor devices 112 or portions of the semiconductor devices 112 may be coincident with the tapered sidewalls of the shallow trenches 166 such that portions of the semiconductor devices 112 are horizontally offset from the fill structure 242 that aligns with the tapered sidewalls.

In some embodiments, the fill structure 242 comprises at least one of a first fill side 244 or a second fill side 246. The first fill side 244 may align with the first reflection sidewall 226 and the second fill side 246 may align with the second reflection sidewall 228. The first fill side 244 has a first fill slope, such as a negative slope, or the second fill side 246 has a second fill slope, such as a positive slope. In some embodiments, the second fill slope is opposite in polarity relative to the first fill slope. In some embodiments, the fill structure 242 has a portion forming a trapezoidal shape such that a third fill side 248 connects the first fill side 244 to the second fill side 246. In some embodiments, the third fill side 248 is perpendicular to the direction 113. In some embodiments, a cross-sectional area of the fill structure 242 decreases along the direction 113, such that a width of an upper portion of the fill structure 242 is greater than a width of a lower portion of the fill structure 242.

In some embodiments, the fill structure 242 has a fourth fill side 250, a fifth fill side 252, a sixth fill side 254, a seventh fill side 256, and an eighth fill side 258. The fourth fill side 250 connects the first fill side 244 with the fifth fill side 252, the fifth fill side 252 connects the fourth fill side 250 with the sixth fill side 254, the sixth fill side 254 connects the fifth fill side 250 with the seventh fill side 256, and the seventh fill side 256 connects the sixth fill side 254 with the second fill side 246. In some embodiments, the fourth fill side 250 or the eighth fill side 258 are perpendicular to the direction 113. In some embodiments, the buffer structure 212 comprises a first oxide layer formed within the shallow trench 168 of the semiconductor substrate 102 and the fill structure 242 comprises a second oxide layer that covers a top surface of the adhesion structure 236, a top surface of the electromagnetic reflection structure 234, and an inner surface of the electromagnetic reflection structure 234. Other processes and/or techniques for forming the fill structure 242 are within the scope of the present disclosure.

FIG. 1S illustrates the fill structures encapsulating electromagnetic reflection structures and adhesion structures, according to some embodiments. In some embodiments, the fill structure 242 and the buffer structure 212, as illustrated in FIG. 1R, comprise the same type material and comprise a second fill structure 260. In some embodiments, the second fill structure 260 completely surrounds the electromagnetic reflection structure 234 and the adhesion structure 236. In some embodiments, a top surface of the electromagnetic reflection structure 234 and a top surface of the adhesion structure 236 are separated by the top side 108 of the semiconductor substrate 102 by the top side distance 238 of the second fill structure 260. The top surface of the electromagnetic reflection structure 234 and the top surface of the adhesion structure 236 extend into the semiconductor substrate 102 by the top side distance 238 from the top side 108 of the semiconductor substrate 102 while being surrounded by the second fill structure 260.

In some embodiments, the semiconductor arrangement 100 includes one or more semiconductor structures, such as a semiconductor structure 268. The semiconductor structure 268 includes one or more shallow trench isolation structures 270 (STI structures), such as a first STI structure 272 and a second STI structure 274. The first STI structure 272 is within the semiconductor substrate 102. The first STI structure 272 includes the buffer structure 212, the adhesion structure 236, the electromagnetic reflection structure 234, and the fill structure 242. The adhesion structure 236 is between and adhesively bonded to the buffer structure 212 and the electromagnetic reflection structure 234. The electromagnetic reflection structure 234 is between the adhesion structure 236 and the fill structure 242 to reflect electromagnetic radiation. In some embodiments, the first STI structure 272 is laterally offset from a semiconductor device, such as the first semiconductor device 112a. In some embodiments, the second STI structure 274 is laterally offset from a semiconductor device, such as the second semiconductor device 112b, such that the second semiconductor device 112b is between the first STI structure 272 and the second STI structure 274. In some embodiments, the first STI structure 272 extends into the semiconductor substrate 102 a first depth (e.g., the top side distance 238) from the top side 108 of the semiconductor substrate 102 and the second semiconductor device 112b extends into the semiconductor substrate 102 a second depth (e.g., the device distance 138), less than the first depth, from the top side 108 of the semiconductor substrate 102. Other configurations and/or arrangements of the second fill structure 260 are within the scope of the present disclosure.

FIG. 1T illustrates a second dielectric layer 280 formed over the semiconductor substrate 102, according to some embodiments. In some embodiments, the second dielectric layer 280 is in direct contact with at least one of the top side 108 of the semiconductor substrate 102, one or more of the first dielectric layer portions (e.g., the first dielectric layer portion 148), or the top sides of the second fill structures (e.g., the sixth fill side 254 of the second fill structure 260). In some embodiments, the second dielectric layer 280 is in indirect contact with at least one of the top side 108 of the semiconductor substrate 102, one or more of the first dielectric layer portions (e.g., the first dielectric layer portion 148), or the top sides of the second fill structures (e.g., the sixth fill side 254 of the second fill structure 260).

The second dielectric layer 280 comprises at least one of SiO, $SiO_2$, SiN, $Si_3N_4$, MgO, $Al_2O_3$, $Yb_2O_3$, ZnO, $Ta_2O_5$, $ZrO_2$, $HfO_2$, $TeO_2$, $TiO_2$, an oxide layer, or other suitable material. The first dielectric layer 144 is formed by at least one of PVD, sputtering, CVD, LPCVD, ALCVD, UHVCVD, RPCVD, ALD, MBE, LPE, spin on, growth, or other suitable techniques. In some embodiments, the second dielectric layer 280 comprises the same material type as the first dielectric layer 144.

In some embodiments, the semiconductor arrangement 100 comprises a buffer layer (not shown) between the semiconductor substrate 102 and the second dielectric layer 280, as described in greater detail here. In some embodiments, the buffer layer is in direct contact with at least one of the top side 108 of the semiconductor substrate 102, one or more of the first dielectric layer portions (e.g., the first dielectric layer portion 148), or the top sides of the second fill structures (e.g., the sixth fill side 254 of the second fill structure 260). In some embodiments, the buffer layer is in indirect contact with at least one of the top side 108 of the semiconductor substrate 102, one or more of the first dielectric layer portions (e.g., the first dielectric layer portion 148), or the top sides of the second fill structures (e.g., the sixth fill side 254 of the second fill structure 260). Other structures and/or configurations of the second dielectric layer 280 are within the scope of the present disclosure.

Figure 2:
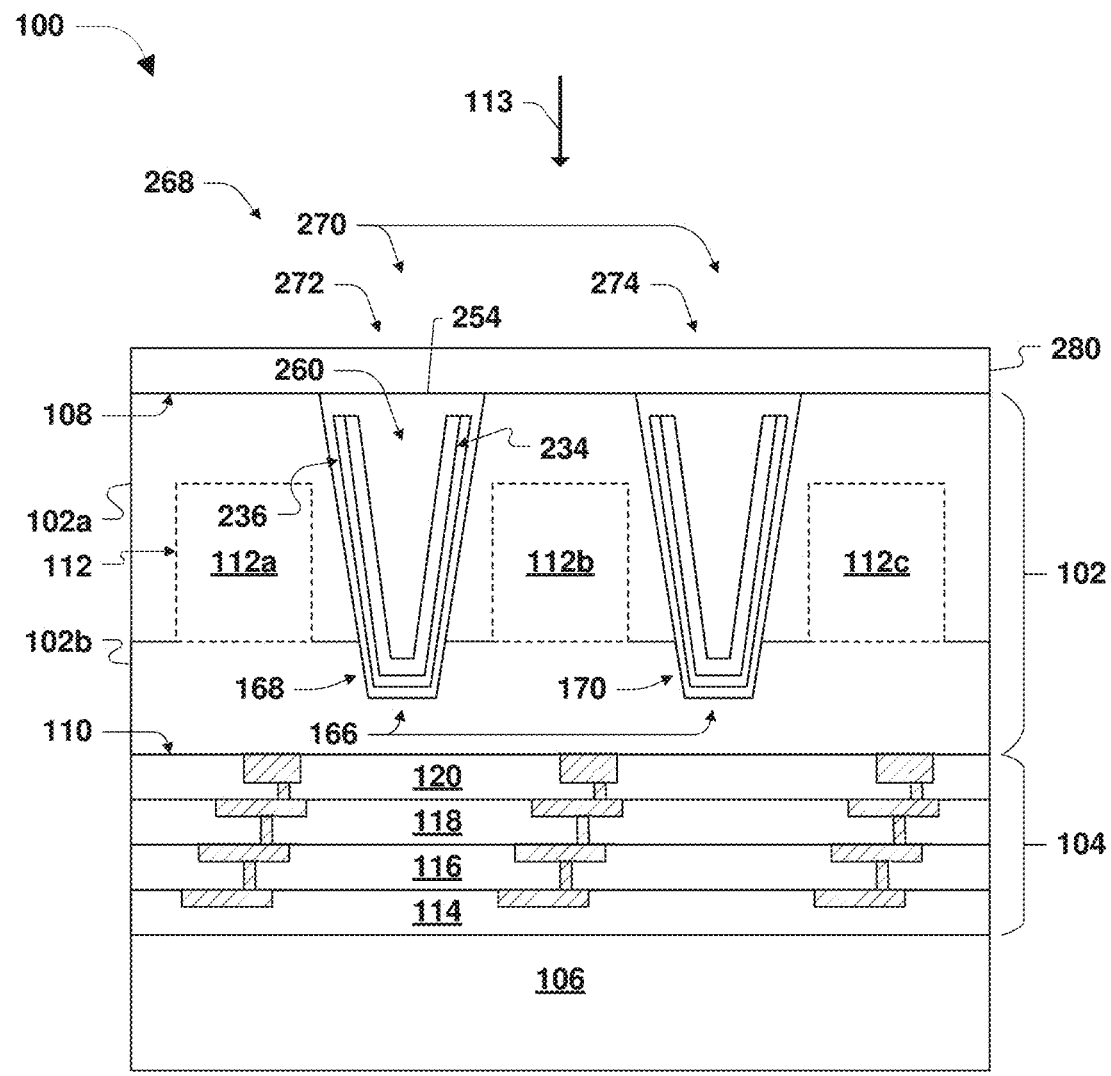
FIG. 2 is a cross-sectional view of a semiconductor arrangement, according to some embodiments.

FIG. 2 is a cross-sectional view of a semiconductor arrangement 100, according to some embodiments. In some embodiments, the semiconductor structure 268 is formed without the dielectric layer portions, such as the first dielectric layer portion 148, as illustrated in FIG. 1M. Hence, the recesses 130 as illustrated in FIG. 1F are not formed in the semiconductor substrate 102. As illustrated in FIG. 2, the top side 108 of the semiconductor substrate 102 is generally perpendicular to the direction 113. In some embodiments, the second dielectric layer 280 is in direct contact with at least one of the top side 108 of the semiconductor substrate 102, or the top sides of the second fill structures (e.g., the sixth fill side 254 of the second fill structure 260). In some embodiments, the second dielectric layer 280 is in indirect contact with at least one of the top side 108 of the semiconductor substrate 102, or the top sides of the second fill structures (e.g., the sixth fill side 254 of the second fill structure 260). Other structures and/or configurations of the semiconductor structure 268 are within the scope of the present disclosure.

Figure 3:
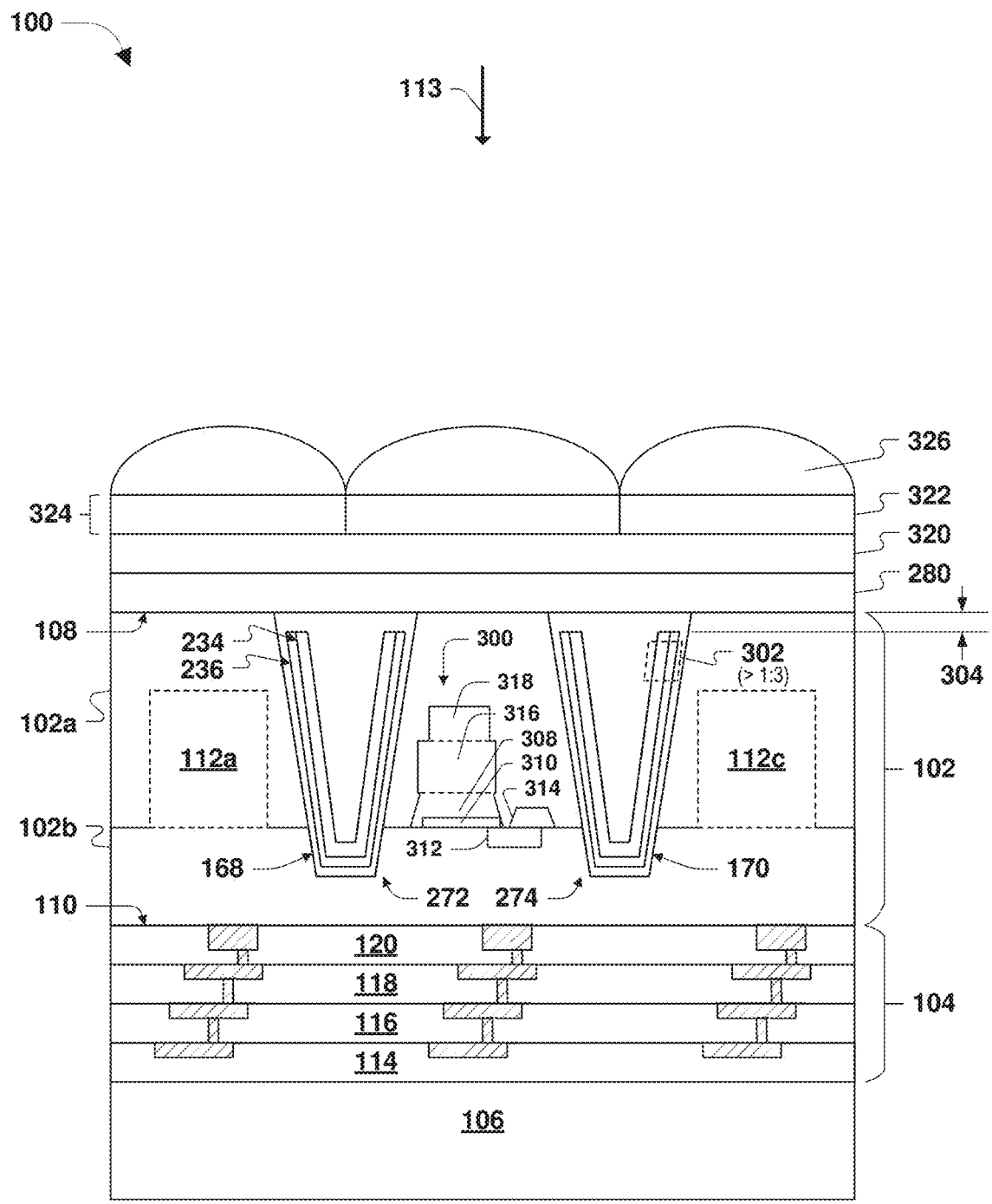
FIG. 3 is a cross-sectional view of a semiconductor arrangement 100, according to some embodiments.

FIG. 3 is a cross-sectional view of a semiconductor arrangement 100, according to some embodiments. In some embodiments, one or more of the semiconductor devices, such as the second semiconductor device 112b, are arranged as a photodiode 300 formed over the semiconductor substrate 102. The photodiode 300 comprises a charge storage well 308, a pinning layer 310, a transfer gate 312, and a floating diffusion 314. In some embodiments, the photodiode 300 comprises a first deep storage well section 316 and a second deep storage well section 318. In FIG. 3, the pinning layer 310 is arranged between the second region 102b and the charge storage well 308. In some embodiments, elements of the photodiode 300 are adjacent to an STI structure, such as the first STI structure 272 or the second STI structure 274. In some embodiments, elements of the photodiode 300 are directly adjacent to an STI structure, such as the first STI structure 272 or the second STI structure 274. In some embodiments, the STI structures, such as the first STI structure 272, are at least one of horizontally coincident with the photodiode 300, horizontally coincident with a portion of the photodiode 300, horizontally offset from the photodiode 300, or horizontally offset from a portion of the photodiode 300. For example, as illustrated in FIG. 3, the first STI structure 272 is horizontally offset from the photodiode 300 and the second STI structure 274 is horizontally offset from the photodiode 300.

According to some embodiments, a ratio 302 of thickness of the adhesion layer 236 to the reflection layer 234 (e.g., Ti/TiN thickness) is greater than (>) 1:3. The ratio 302 is not merely a matter of design choice, but is critical to, at least, provide sufficient reflectivity of the shallow trench 168 while not consuming too much space. As set forth in greater detail herein and in some embodiments, the adhesion layer 236 and the reflection layer 234 (e.g., a Ti/TiN layer) are fully buried inside the second fill structure 260 (e.g., an oxide film) to mitigate against contamination. As set forth in greater detail herein and in some embodiments, a distance 304 from the adhesion layer 236 and the reflection layer 234 (e.g., a Ti/TiN layer) to the oxide surface (e.g., below the second dielectric layer 280) is greater than (>) 100 Å.

In some embodiments, an ARC layer 320 (i.e., an anti-reflective coating layer) is arranged over the photodiode 300 and over the semiconductor substrate 102. A radiation filter layer 322 is arranged over the ARC layer 320, over the photodiode 300, and over the semiconductor substrate 102. The radiation filter layer 322 comprises a plurality of radiation pass filters 324, each configured to allow a radiation pass range of wavelengths to pass through and be detected by the corresponding photodiode. In some embodiments, a micro-lens array 326 is arranged over the ARC layer 320 and the radiation filter layer 322, according to some embodiments. The micro-lens array 326 is arranged to steer radiation towards underlying photodiodes, such as the photodiode 300. The micro-lens array 326 includes a plurality of micro-lenses configured to transmit radiation to a corresponding photodiode.

Figure 4:
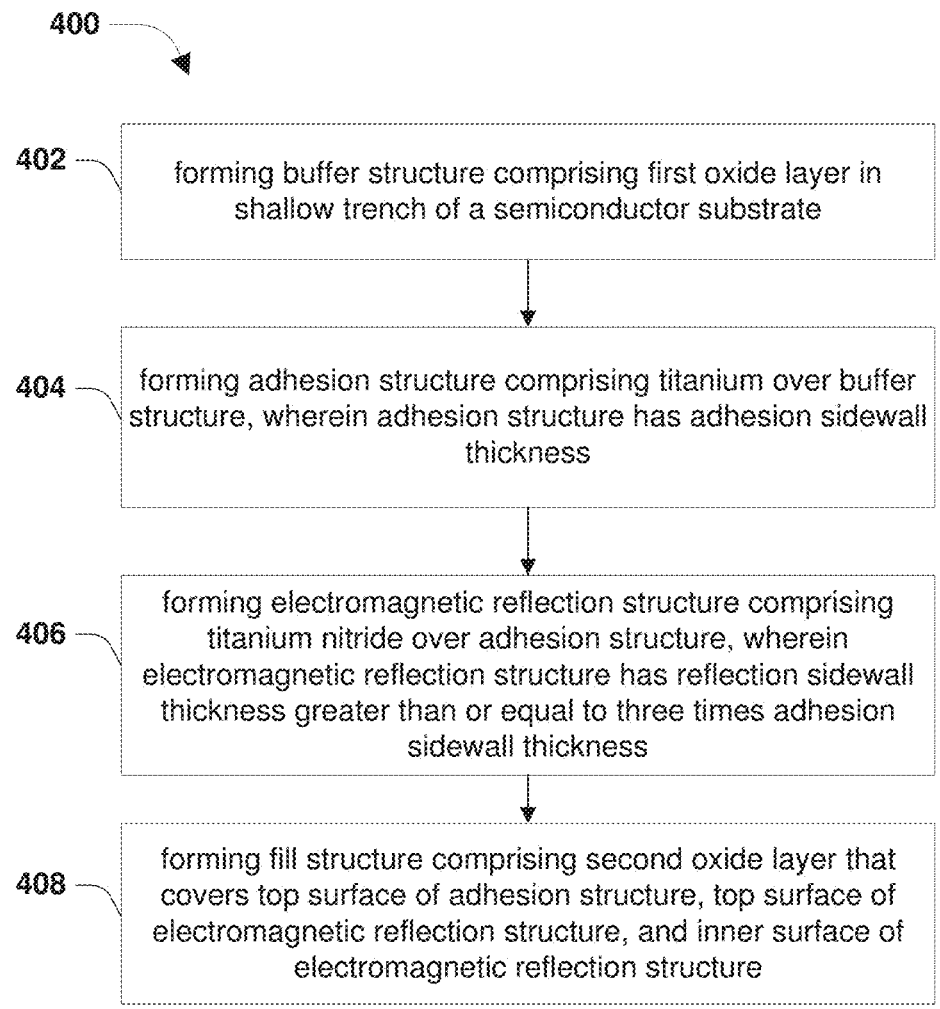
FIG. 4 illustrates an example method, according to some embodiments.

FIG. 4 illustrates an example method 400 for forming a semiconductor structure according to some embodiments. Some of the operations described can be replaced and/or eliminated for different embodiments. At 402, a buffer structure comprising a first oxide layer is formed in a shallow trench of a semiconductor substrate. For example, in FIG. 1M, the buffer structure 212 is formed from the buffer layer 202 in the shallow trench 168 of the semiconductor substrate 102, where the buffer layer 202 may comprise an oxide layer.

At 404, an adhesion structure comprising titanium is formed over the buffer structure, wherein the adhesion structure has an adhesion sidewall thickness. For example, in FIG. 1P, the adhesion structure 236 is formed from the adhesion layer 214 over the buffer structure 212, where the adhesion layer 214 may comprise titanium and the adhesion structure 236 may have the adhesion sidewall thickness 222.

At 406, an electromagnetic reflection structure comprising titanium nitride is formed over the adhesion structure, wherein the electromagnetic reflection structure has a reflection sidewall thickness greater than or equal to three times the adhesion sidewall thickness. For example, in FIG. 1P, the electromagnetic reflection structure 234 is formed over the adhesion structure 236, where the electromagnetic reflection structure 234 may comprise titanium nitride and have the reflection sidewall thickness 232 greater than or equal to three times the adhesion sidewall thickness 222.

At 408, a fill structure comprising a second oxide layer is formed that covers a top surface of the adhesion structure, a top surface of the electromagnetic reflection structure, and an inner surface of the electromagnetic reflection structure. For example, in FIG. 1R, the fill structure 242 is formed from the second buffer layer 240 and covers the top surface of the adhesion structure 236, the top surface of the electromagnetic reflection structure 234, and the inner surface of the electromagnetic reflection structure 234. The second buffer layer 240 may comprise a second oxide layer.

In some embodiments, a semiconductor structure is provided. The semiconductor structure includes a first shallow trench isolation (STI) structure within a semiconductor substrate and the first STI structure comprises a buffer structure, an adhesion structure, an electromagnetic reflection structure, and a fill structure. The adhesion structure is between and adhesively bonded to the buffer structure and the electromagnetic reflection structure. The electromagnetic reflection structure is between the adhesion structure and the fill structure to reflect electromagnetic radiation.

In some embodiments, a semiconductor structure is provided. The semiconductor structure includes a photodiode within a semiconductor substrate and a first shallow trench isolation (STI) structure laterally offset from the photodiode within the semiconductor substrate. The first STI structure includes a buffer structure comprising a first oxide layer and formed within a shallow trench of the semiconductor substrate and an adhesion structure comprising titanium and formed as an adhesion layer over the first oxide layer. An electromagnetic reflection structure comprising titanium nitride is formed as a reflection layer over the adhesion layer and a fill structure, comprising a second oxide layer, covers a top surface of the adhesion structure, a top surface of the electromagnetic reflection structure, and an inner surface of the electromagnetic reflection structure.

A method for forming a semiconductor structure is provided. The method includes forming a buffer structure comprising a first oxide layer in a shallow trench of a semiconductor substrate and forming an adhesion structure comprising titanium over the buffer structure, wherein the adhesion structure has an adhesion sidewall thickness. The method includes forming an electromagnetic reflection structure comprising titanium nitride over the adhesion structure, wherein the electromagnetic reflection structure has a reflection sidewall thickness greater than or equal to three times the adhesion sidewall thickness. The method includes forming a fill structure comprising a second oxide layer that covers a top surface of the adhesion structure, a top surface of the electromagnetic reflection structure, and an inner surface of the electromagnetic reflection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising".

Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor structure, comprising:
   a first shallow trench isolation (STI) structure within a semiconductor substrate, wherein:
      the first STI structure comprises a buffer structure, an adhesion structure, an electromagnetic reflection structure, and a fill structure;
      the adhesion structure is between and adhesively bonded to the buffer structure and the electromagnetic reflection structure;
      the electromagnetic reflection structure is between the adhesion structure and the fill structure to reflect electromagnetic radiation;
      the buffer structure comprises a first oxide layer formed within a shallow trench of the semiconductor substrate; and
      the fill structure comprises a second oxide layer that covers a top surface of the adhesion structure, a top surface of the electromagnetic reflection structure, and an inner surface of the electromagnetic reflection structure.

2. The semiconductor structure of claim 1, wherein
   the buffer structure is contiguous with a doped region of the semiconductor substrate; and
   the buffer structure has a buffer sidewall thickness between about 100 Angstroms to about 500 Angstroms to buffer against dopants of the doped region.

3. The semiconductor structure of claim 1, wherein:
   the adhesion structure comprises titanium and is formed as an adhesion layer contiguous with the buffer structure.

4. The semiconductor structure of claim 1, wherein:
   the adhesion structure has an adhesion sidewall thickness greater than about 100 Angstroms.

5. The semiconductor structure of claim 1, wherein:
   the electromagnetic reflection structure comprises titanium nitride and is formed as a reflection layer contiguous with the adhesion structure.

6. The semiconductor structure of claim 1, wherein:
the adhesion structure has an adhesion sidewall thickness; and
the electromagnetic reflection structure has a reflection sidewall thickness greater than the adhesion sidewall thickness.

7. The semiconductor structure of claim 6, wherein:
the reflection sidewall thickness is greater than or equal to three times the adhesion sidewall thickness.

8. The semiconductor structure of claim 1, wherein:
the second oxide layer has a second oxide top layer thickness greater than or equal to 100 Angstroms over the top surface of the adhesion structure and the top surface of the electromagnetic reflection structure.

9. The semiconductor structure of claim 1, wherein the first oxide layer has a greater refractive index than the second oxide layer.

10. The semiconductor structure of claim 1, wherein:
the fill structure comprises at least one of silicon dioxide, silicon oxynitride, or hafnium oxide.

11. The semiconductor structure of claim 1, wherein:
the buffer structure comprises at least one of aluminum oxide or hafnium oxide.

12. The semiconductor structure of claim 1, wherein at least one of:
the adhesion structure comprises a mixture of titanium and a first metal; or
the electromagnetic reflection structure comprises a mixture of titanium nitride and a second metal.

13. The semiconductor structure of claim 1, comprising:
a semiconductor device within the semiconductor substrate, wherein the first STI structure is laterally offset from the semiconductor device.

14. The semiconductor structure of claim 13, comprising:
a second STI structure within the semiconductor substrate and laterally offset from the semiconductor device, wherein:
the semiconductor device is between the first STI structure and the second STI structure.

15. The semiconductor structure of claim 13, wherein:
the first STI structure extends into the semiconductor substrate a first depth from a top side of the semiconductor substrate; and
the semiconductor device extends into the semiconductor substrate a second depth, less than the first depth, from the top side of the semiconductor substrate.

16. A semiconductor structure, comprising:
a photodiode within a semiconductor substrate; and
a first shallow trench isolation (STI) structure laterally offset from the photodiode within the semiconductor substrate, comprising:
a buffer structure comprising a first oxide layer and formed within a shallow trench of the semiconductor substrate;
an adhesion structure comprising titanium and formed as an adhesion layer over the first oxide layer;
an electromagnetic reflection structure comprising titanium nitride and formed as a reflection layer over the adhesion layer; and
a fill structure comprising a second oxide layer that covers a top surface of the adhesion structure, a top surface of the electromagnetic reflection structure, and an inner surface of the electromagnetic reflection structure.

17. The semiconductor structure of claim 16, wherein:
the shallow trench has a first trench tapered sidewall tapered toward the photodiode;
the buffer structure has a first buffer tapered sidewall that aligns with the first trench tapered sidewall;
the adhesion structure has a first adhesion tapered sidewall that aligns with the first buffer tapered sidewall; and
the electromagnetic reflection structure has a first reflection tapered sidewall that aligns with the first adhesion tapered sidewall.

18. A semiconductor structure, comprising:
a first shallow trench isolation (STI) structure within a semiconductor substrate, wherein:
the first STI structure comprises a buffer structure, an adhesion structure, an electromagnetic reflection structure, and a fill structure;
the adhesion structure is between and adhesively bonded to the buffer structure and the electromagnetic reflection structure;
the electromagnetic reflection structure is between the adhesion structure and the fill structure to reflect electromagnetic radiation; and
the adhesion structure comprises titanium and is formed as an adhesion layer contiguous with the buffer structure.

19. The semiconductor structure of claim 18, wherein:
the buffer structure comprises a first oxide layer; and
the fill structure comprises a second oxide layer.

20. The semiconductor structure of claim 19, wherein:
the second oxide layer covers a top surface of the electromagnetic reflection structure and an inner surface of the electromagnetic reflection structure.

\* \* \* \* \*